(12) United States Patent
Hall et al.

(10) Patent No.: US 7,486,513 B2
(45) Date of Patent: Feb. 3, 2009

(54) METHOD AND APPARATUS FOR COOLING AN EQUIPMENT ENCLOSURE THROUGH CLOSED-LOOP LIQUID-ASSISTED AIR COOLING IN COMBINATION WITH DIRECT LIQUID COOLING

(75) Inventors: Shawn A. Hall, Pleasantville, NY (US); Shurong Tian, Yorktown Heights, NY (US); Paul W. Coteus, Yorktown Heights, NY (US); John P. Karidis, Ossining, NY (US); Evan G. Colgan, Chestnut Ridge, NY (US); Robert W. Guernsey, Jr., Garrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/862,289

(22) Filed: Sep. 27, 2007

(65) Prior Publication Data

US 2008/0055851 A1 Mar. 6, 2008

Related U.S. Application Data

(63) Continuation of application No. 11/427,384, filed on Jun. 29, 2006, now Pat. No. 7,342,789.

(60) Provisional application No. 60/695,378, filed on Jun. 30, 2005.

(51) Int. Cl.
*H05K 7/20* (2006.01)
(52) U.S. Cl. ............... 361/699; 361/695; 361/696; 361/701; 361/721; 165/80.4; 165/104.33
(58) Field of Classification Search ......... 361/687–697, 361/699, 701–702, 721; 165/80.3–80.5, 165/104.19, 104.33; 62/259.2; 324/158.1, 324/760; 454/184
See application file for complete search history.

(56) References Cited

U.S. PATENT DOCUMENTS

| 3,749,981 | A | | 7/1973 | Koltuniak et al. |
| 5,144,531 | A | | 9/1992 | Go et al. |
| 5,285,347 | A | * | 2/1994 | Fox et al. ............ 361/699 |
| 5,644,248 | A | * | 7/1997 | Fujimoto ............ 324/760 |
| 5,767,690 | A | * | 6/1998 | Fujimoto ............ 324/760 |
| 5,978,218 | A | * | 11/1999 | Fujimoto et al. ......... 361/696 |

(Continued)

OTHER PUBLICATIONS

Chu et al., "System Cooling Design Considerations for Large Mainframe Computers", National Science Foundation, pp. 365-387, 1991.*

*Primary Examiner*—Boris L Chervinsky
(74) *Attorney, Agent, or Firm*—Scully, Scott, Murphy & Presser, P.C.; Daniel P. Morris, Esq.

(57) ABSTRACT

A method and an apparatus for cooling, preferably within an enclosure, a diversity of heat-generating components, with at least some of the components having high-power densities and others having low-power densities. Heat generated by the essentially relatively few high-power-density components, such as microprocessor chips for example, is removed by direct liquid cooling, whereas heat generated by the more numerous low-power or low-watt-density components, such as memory chips for example, is removed by liquid-assisted air cooling in the form of a closed loop comprising a plurality of heating and cooling zones that alternate along the air path.

14 Claims, 22 Drawing Sheets

U.S. PATENT DOCUMENTS

| | | |
|---|---|---|
| 6,208,510 B1 * | 3/2001 | Trudeau et al. ............. 361/696 |
| 6,305,180 B1 | 10/2001 | Miller et al. |
| 6,462,949 B1 | 10/2002 | Parish, IV et al. |
| 6,506,111 B2 | 1/2003 | Sharp et al. |
| 6,580,609 B2 | 6/2003 | Pautsch |
| 6,621,707 B2 | 9/2003 | Ishimine et al. |
| 6,628,520 B2 | 9/2003 | Patel et al. |
| 6,646,879 B2 | 11/2003 | Pautsch |
| 6,775,137 B2 | 8/2004 | Chu et al. |
| 6,819,563 B1 | 11/2004 | Chu et al. |
| 6,864,698 B2 * | 3/2005 | Mirkhani et al. ............ 324/760 |
| 2004/0221604 A1 | 11/2004 | Ota et al. |
| 2006/0102322 A1 | 5/2006 | Madara et al. |

* cited by examiner

METHOD AND APPARATUS FOR COOLING AN EQUIPMENT ENCLOSURE THROUGH CLOSED-LOOP LIQUID-ASSISTED AIR COOLING IN COMBINATION WITH DIRECT LIQUID COOLING

CROSS-REFERENCE TO RELATED APPLICATION

This application claims the benefit of the filing date of U.S. Provisional Patent Application No. 60/695,378; filed on Jun. 30, 2005; the disclosure of which is incorporated herein in its entirety.

CROSS REFERENCE TO RELATED APPLICATION

This application is a continuation application of U.S. Ser. No. 11/427,384; filed on Jun. 29, 2006 now U.S. Pat. 7,342,789.

The present application was made with U.S. Government support under Contract No. NBCH 3039004 awarded by the Defense, Advanced Research Projects Agency, in view of which the U.S. Government has certain rights in this invention.

BACKGROUND OF THE INVENTION

1. Field of the Invention

The present invention relates to the cooling of enclosures, such as racks, for diverse types of equipment, such as heat-producing electronics, through a combination of air and liquid cooling for very high total power levels of the equipment.

For instance, as heat is generated during operation of electronic equipment, such as that comprising an integrated-circuit chip (IC), the thermal resistance between chip junction and the medium employed for the removal of heat must be sufficiently small in order to provide a junction temperature that is low enough to insure the continued reliable operation of the equipment. However, the problem of adequate heat removal becomes ever more difficult to solve as chip geometry is scaled down and operating speeds of the electronic equipment are increased, resulting in an increased power density ($W/cm^2$) at the surface of the chip. The problem is further exacerbated when different types of chips in close proximity with each other possess different cooling requirements. For example, in a computer system, a processor chip may have a much higher power density than closely located memory chips. Furthermore, as another example, different types of chips may have different maximum-allowable junction temperatures. Such cooling requirements impose mechanical and thermal packaging challenges to the equipment design that can limit the performance thereof. In the current technology, the power density of processor and other kinds of high-performance chips is rapidly approaching levels that exceed the capability of forced-air cooling, necessitating the use of liquid cooling for some applications and installations in order to be able to attain the requisite degree of cooling for the equipment.

The cooling of computer racks and other types of electronic equipment is typically accomplished by forced-air cooling; however, liquid-assisted air cooling and direct-liquid cooling, frequently with water as the cooling medium, have also been widely employed. This concept is discussed in Richard C. Chu, et al., "Review of Cooling Technologies for Computer Products", *IEEE Transactions on Device and Materials Reliability*, Vol. 4, No. 4, pp. 568-585, (December 2004). In liquid-assisted air cooling, a liquid-cooled heat exchanger is placed in a heated air stream in order to extract heat and reduce the air temperature before it is expelled into the room. Chu, et al. (Supra) also describe the problems encountered with data-center thermal management, in which the power dissipated for each equipment rack is approaching 30 kW. In a typical modern data center, water-cooled air-conditioning units or other external cooling devices are used to provide, through perforations in a raised floor or through ducts, a stream of chilled air to the computers, in which the air is heated, and downstream of which the air is returned to air-conditioning units so as to be chilled again. Significant problems encountered with this approach include the need for the large circulatory volume of air required to adequately cool the electronics, the extensive raised-floor space required to handle this air volume, the accompanying high acoustic noise levels encountered in the room, and the difficulty of controlling the airflow in the room to prevent already-hot air from re-circulating into the electronics, thereby potentially leading to overheating and electronic failure of the equipment. Moreover, the computer machine room can be uncomfortable for human occupancy because of large temperature differences present between room areas cooled by the cold inlet air and room areas heated by the hot outlet air. It is noted hereby that traditional data-center cooling is basically quite similar to liquid-assisted air cooling in that, in both instances, heat is initially transferred from the electronics to air. The difference resides in the location of the subsequent heat transfer from air to liquid: in traditional data-center cooling, this air-to-liquid heat transfer occurs outside the computer racks, typically in air-conditioning units where the liquid is water, whereas in liquid-assisted air cooling, it occurs within the computer racks.

2. Discussion of the Prior Art

Various methods and apparatus have been developed in the technology for the purpose of imparting adequate cooling to diverse types of operating equipment, such as electronic devices functioning at high power levels and which generate considerable amounts of heat, which must be dissipated.

Chu, et al., U.S. Pat. No. 6,819,563 B1, which is commonly assigned to the present assignee, and the disclosure of which is incorporated herein by reference, discloses a method and system for augmenting the air cooling of rack-mounted electronics systems by using a cooling fluid to cool air entering the system, and to remove a portion of the heat dissipated by the electronics being cooled. A drawback in the adding of heat exchangers to an electronic rack is due to an increased flow resistance that reduces airflow through the rack. In the patent, the air path is an open loop, whereas the present invention is directed to the provision of a closed-loop air path inside the rack.

Chu, et al., U.S. Pat. No. 6,775,137 B2, which is commonly assigned to the present assignee, and the disclosure of which is incorporated herein by reference, relates to an enclosure apparatus that provides for a combined air and liquid cooling of rack-mounted, stacked electronic components. A heat exchanger is mounted on the side of the stacked electronic components, and air flows from the front to the back within the enclosure, impelled by air-moving devices mounted behind the electronic components. A drawback in adding a heat exchanger to the side of an electronics rack is the requirement for an increase in floor space. Moreover, a front-to-back airflow within the confines of the rack does not allow for the use of a continuous midplane for the electronic components.

Patel, et al, U.S. Pat. No. 6,628,520 describes an apparatus for housing electronic components that includes an enclosure, mounting boards with electronic components mounted thereon, a supply plenum for cooling air, one or more outlets, which are directed toward the mounting boards, one or more heat-exchanging devices, and one or more blowers. A significant limitation in this arrangement resides in that inlet and outlet plenums for the air are needed along opposite sides of the electronics rack, in addition to the space required at the top and bottom of the rack, which is used to reverse the direction of the air flow.

Ishimine, et al., U.S. Pat. No. 6,621,707 pertains to an electronic apparatus comprising a motherboard, multi-chip modules mounted to the motherboard, cooling members for cooling the multi-chip modules, a refrigeration unit for cooling the cooling members to room temperature or lower, and a connection structure to releasably couple each multi-chip module thermally and mechanically to the refrigeration unit. In contrast therewith, the present invention does not use a refrigeration unit, or require a substantially hermetically sealed box structure, or a drying means for supplying dry air for cooling purposes.

Sharp, et al, U.S. Pat. Nos. 6,506,111 B2 and 6,652,373 B2 each describe a rack with a closed-loop airflow and a heat exchanger. The air flows vertically up one side of the rack, horizontally across electronics devices, vertically down the other side of the rack, and then across a heat exchanger located in the base, or optionally on the tops, of the rack. Because the air path is much shorter for memory cards near the heat exchanger location, a perforated plate is included in one of the vertical paths to enable adjustment of the airflow across the various memory cards to match some desired, e.g., constant distribution. The present invention does not require the vertical plenums, which occupy valuable space, or the perforated plate.

Parish IV, et al., U.S. Pat. No. 6,462,949 B1 discloses a cooling apparatus using "low-profile extrusions" to cool electronic components mounted on a board or card, whereas contrastingly, the present invention does not use any "low-profile extrusions" or similar structure.

Miller, et al., U.S. Pat. No. 6,305,180 B1 discloses a system for cooling electronic equipment using a chiller unit between adjacent racks for returning cooled air to ambient. Contrastingly, the present invention is distinct from the foregoing because in the system described therein, the air is re-circulated within the rack rather than being expelled to the ambient environment.

Go, et al., U.S. Pat. No. 5,144,531 is directed to a liquid cooling system comprising cold plates attached to their respective circuit modules, quick couplers for connecting flexible hoses to these cold plates, a supply duct, and a return duct to form strings of cold plates, which are connected between the supply duct and the return duct. Valved quick couplers are used for the connection to the supply duct and the return duct, and valveless quick couplers are used for the connection to the cold plates. In contrast, pursuant to the present invention, a quick connect is not used to connect to the cold plate, though quick connects may be employed for the connections to each individual blade.

Koltuniak, et al., U.S. Pat. No. 3,749,981 describes a modular power supply wherein the power modules, each with its own fans, are mounted inside a sealed cabinet. Also mounted inside the cabinet are cooling modules, each with its own fan and heat exchanger. This patent represents an early example in the technology of an air-recirculation system requiring shared airflow plenums that occupy valuable space.

Ward, et al., U.S. Pat. No. 3,387,648 pertains to a cabinet-enclosed cooling system for electronic modules mounted on a modular chassis, wherein the chassis is extensible from the cabinet. This is an example of an air-recirculation system that requires, at the front and back of the assembly, shared vertical air plenums which unnecessarily occupy valuable space.

In implementing the construction of high-performance computer systems, it is desirable to be able to electrically interconnect as many processor chips and memory cards as possible while using conventional and economically priced electronic packaging methods. Thereby, the more densely and closely packed the electronics are, the more difficult they are to cool, because space is required for air circulation and for heat sinks. One method of achieving dense packaging of the electronic components is to build modular units called "blades", each of which contains one or more processors and memory card(s). Multiple blades are then plugged into a common electrical backplane, or midplane, which, because of its high wiring density, provides for a high-speed and cost-effective inter-blade communication. Moreover, the modularity of blades allows for the sharing of common system resources, and facilitates servicing and configuration changes. Blade-type packaging is not limited to computer systems, but may also be employed for switch systems, or other types of information processing, and for matching and/or mixing of different functions within a single rack or enclosure.

Two features of conventional blade-style packaging essentially limit the performance achievable by the electronic components located within a rack:

1. Front-to-Back Airflow

Racks with blade-style packaging frequently employ vertical backplanes (or midplanes) in conjunction with front-to-back airflow cooling arrangements, thereby requiring airflow holes to be formed in the backplane. Such holes, to a significant extent, block wiring channels in the backplane, thereby greatly reducing the number of I/O's (input/output electrical signaling interconnections) available for connection to the attached blades. Moreover, in such a rack, the relatively small airflow cross-section provided by the holes in the backplane limits total power dissipation to about 30 kW. This aspect is disclosed in the publication by M. J. Crippen, et al., "Blade-Center packaging, power, and cooling", *IBM J. Res. & Dev.*, Vol. 49 No. 6, Nov. 2005, pp. 887-904.

2. Total Reliance on Air-Cooling

As a cooling fluid, air is advantageous vis-a-vis water because it effortlessly bathes myriad heat-producing electronic devices in a safe, insulating cooling fluid. However, air is disadvantageous in comparison with water because its small heat capacity per unit volume, 3500 times smaller than water, limits the power density that may be cooled, and requires a considerable amount of airflow space, which restricts packaging density.

The above-mentioned features of conventional blade-style packaging, front-to-back airflow and total reliance on air cooling, must be clearly improved upon in order to solve the following problems, which are currently in evidence:

(a) limited total power that can be dissipated in a blade-style rack, (b) limited packaging density due to space required for airflow, (b) high engineering cost of customized airflow solutions for conventional raised-floor data centers, (c) excessive data-center noise encountered due to air movers and airflow, and (d) discomfort encountered by personnel in data centers due to non-uniform air temperatures.

SUMMARY OF THE INVENTION

The current invention implements two ideas in a unique and novel manner: first, the use of vertical airflow with vertical backplanes or midplanes; and second, the combined use of both air and water as coolants, in an arrangement that exploits the strengths of both fluids.

As a result, whereas conventional, air-cooled, blade-style packaging limits total power to 30 kW in a noisy rack occupying 2'×3' of floor space (5 kW/ft$^2$), a prototype embodiment of the present invention, with a realistic mix of heat-producing components, will successfully cool a total power of 81 kW in a quiet rack occupying 2.7'×5' of floor space (6 kW/ft$^2$). Moreover, the prototype embodiment indicates that future embodiments could readily cool over 100 kW in such a rack (>7.4 kW/ft$^2$).

Accordingly, the present invention provides for a method and an apparatus for cooling, preferably within an enclosure, a diversity of heat-generating components, with at least some of the components having high power densities and others having low power densities. Direct liquid cooling is used to remove heat generated by a relatively small number of high-power-density components exemplified by microprocessor chips, whereas novel, closed-loop, liquid-assisted air cooling is used to remove heat generated by a relatively large number of low-watt-density components exemplified by memory chips.

In effectuating direct liquid cooling, microchannel coolers or other types of cold heads are attached directly to the high-power-density components. In effectuating closed-loop liquid-assisted air cooling, air travels upwardly in the front half of an enclosure through relatively narrow rectangular packages, referred to as "blades", which contain diverse heat-generating components, and which are positioned in multiple rows located one above the other. Air-to-liquid heat exchangers are interleaved between rows of blades in order to cool the air emerging from each respective blade row before entering the next row. The heat that the air removes from the blade row is transferred in its entirety to the liquid, and is thereby removed from the enclosure, with the air being thereby assisted in its cooling task by means of the liquid. The blades are ordinarily attached to the front side of one or more central, vertical circuit cards, referred to as "midplanes". At the top of the front stack of blades, the air then travels through a first set of air movers that divert the air towards the rear half of the enclosure, and into a first high-pressure plenum. From this top-and-rear-located high-pressure plenum, the air then travels downwardly within the rear half of the enclosure through additional rows of blades attached to the other side of the midplanes, and finally through a second set of air movers that divert the air towards the front half of the enclosure and into a second high-pressure plenum. From this bottom-and-front-located high-pressure plenum, the air again travels upwardly through the front blades, thereby completing a closed loop. This closed-loop, liquid-assisted air cooling architecture enables multiple blades to be connected to the front and rear of the midplanes, thereby facilitating the provision of low-cost, densely arranged, high-performance electrical interconnections within the rack. Because air flowing through the blades travels substantially in parallel with the respective midplane, the midplane does not need to be provided with air-circulation holes, which would tend to block wiring channels, thereby imparting an important advantage to this structural arrangement. Moreover, no vertically directed air plenums, which occupy valuable floor space, are needed in this structure.

On each side of the midplanes, each horizontal row of blades is mechanically supported by a blade cage having bottom and top surfaces, which are substantially open in order to allow for a large volume of a vertical flow of air at a low pressure loss, another important advantage of this arrangement in comparison with the conventional practice of flowing air through small holes formed in the midplanes or backplanes.

Because the air-to-liquid heat exchanger interposed downstream of each blade cage removes from the air, on an average, all heat absorbed therein, the combination of a blade cage and a heat exchanger is thermally neutral for the air; in essence, the air temperature increases from $T_1$ to $T_2$ as it passes through a blade cage, but then decreases from $T_2$ to $T_1$ as it passes through the heat exchanger immediately downstream thereof. The air thereby traverses its closed loop, through M blade cages and M heat exchangers, without any net increase in its temperature. Inasmuch as the air loop is enclosed in the rack, and the walls of the rack are insulated with an acoustic-transmission-loss material, the invention provides for a much quieter, more comfortable room for personnel than that encountered in conventional installations where noisy air movers located in the rack expel to the room large amounts of hot air, which must be collected by air-conditioning units that create additional noise. Eliminating this prior-art construction is yet another important advantage of the present invention.

The liquid in the air-to-liquid heat exchangers is normally carried in piping that is distinct from the piping used to carry the liquid for direct-liquid cooling, so the two liquids may differ, but are typically both water, often with anti-corrosion, algicide, and other additives. In order to save vertical space, a coolant-distribution manifolds for direct-liquid cooling of each blade cage is placed immediately in front of a heat exchanger adjacent to the blade cage, thereby ensuring that a pair of hoses, which connect each blade to the inlet or outlet manifolds, may be disconnected for blade removal without having to disturb other blades. Furthermore, in order to save space in the direction normal to the midplanes, the quick disconnects for the manifolds are mounted at an angle. Such efficient packaging permits a large quantity of electronics to be housed within a small amount of space, thereby presenting another advantage of the invention.

BRIEF DESCRIPTION OF THE INVENTION

Figure 1:
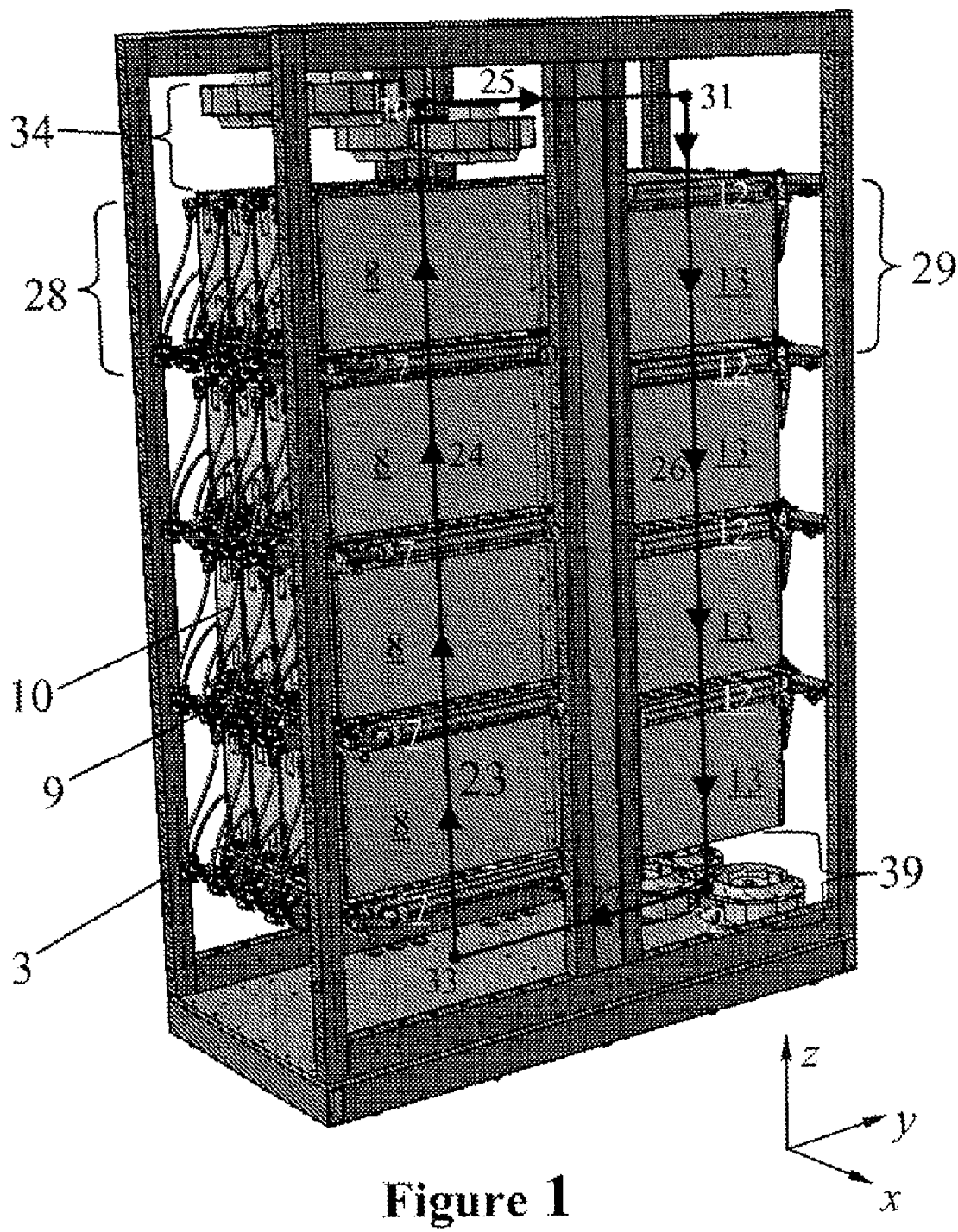
FIG. 1 illustrates a perspective representation of a preferred embodiment of a computer enclosure of the invention showing major interior components thereof.

Referring now specifically to the disclosure, FIG. 1 shows a perspective representation, and FIGS. 2A and 2B show, respectively equivalent front and side elevations, of a preferred embodiment of an enclosure 1, such as for computer or electronic components, and its heat-producing contents. External walls and doors 2, which cover the frame 3 of enclosure 1, shown in FIG. 3, are omitted in FIG. 1 for purposes of visual accessibility to the interior. FIGS. 2A and 2B show an imaginary, Cartesian xyz coordinate system 4 whose xz plane divides the enclosure 1 into a front region 5 (y<0) and a rear region 6 (y>0), and whose yz plane divides the enclosure into two halves (x>0 and x<0). All other Figures show similar xyz coordinate systems whose axes extend in all cases, in parallel with the xyz coordinate system 4 of FIGS. 2A and 2B, but the origins of which may differ.

Figure 22:
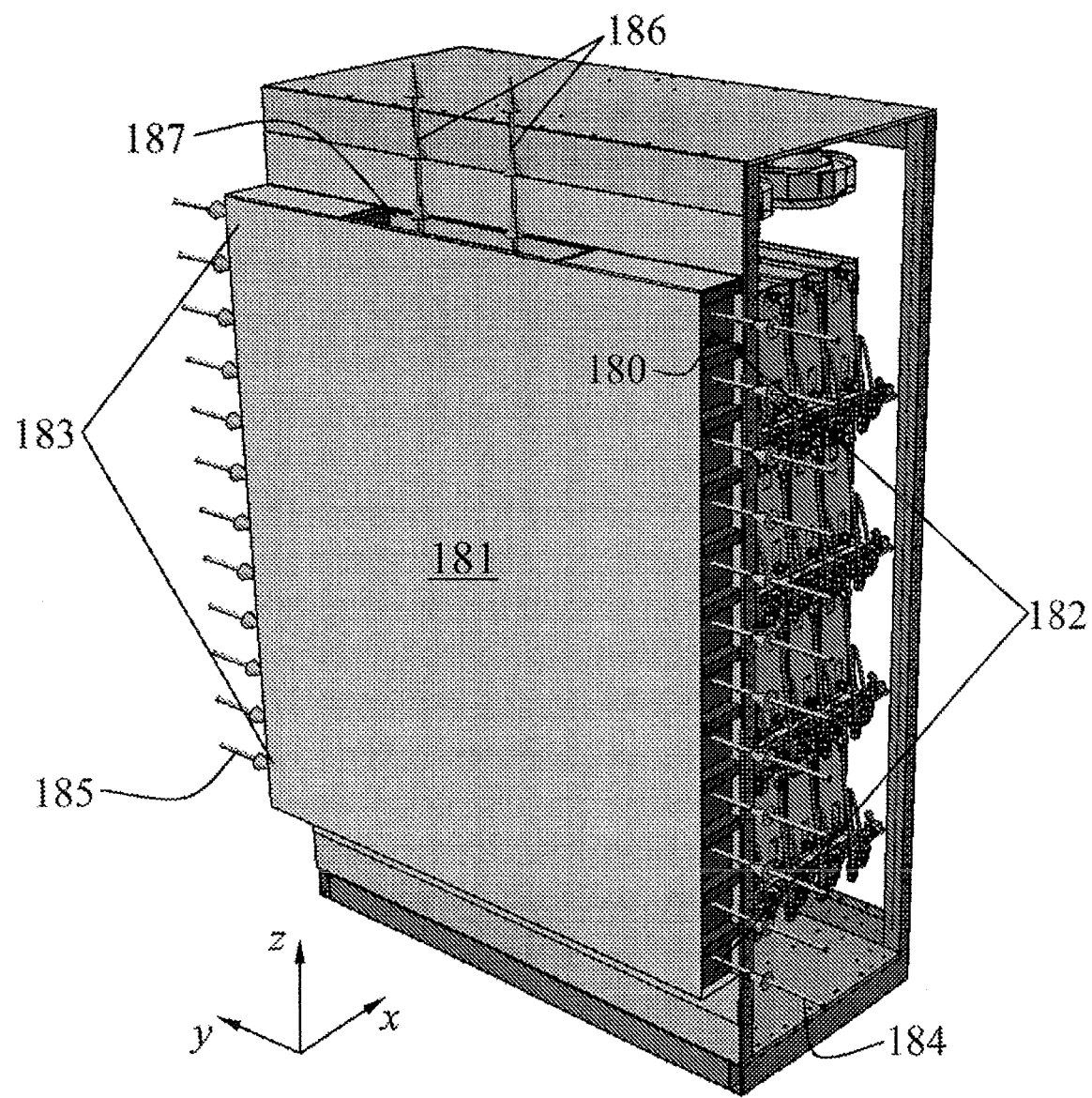
FIG. 22 illustrates a perspective view of the main computer enclosure with an attached enclosure providing for bulk power supplies.

Many of the drawing figures are true-scale representative diminutions of a full-scale, thermal-prototype enclosure built to embody the concepts contained in this application. Frequent reference will be made hereinbelow to the specifics of this prototype embodiment, but it should be understood that the invention is not limited thereto. The x×y×z dimensions of the thermal-prototype enclosure shown in FIG. 3, including the external walls and doors 2, but excluding bulk power supplies that are housed in a separate enclosure (as shown in FIG. 22), are 0.81×1.52×2.13 meters (32×60×84 inches). Experiments indicate that by using the cooling schemes described herein, up to 81 kW of heat (55.8 kW liquid-assisted air cooled, 25.5 kW direct-liquid cooled) may be dissipated in the thermal-prototype enclosure 1 with only modest component temperatures (71° C. worst case, based on over 11,000 measured locations).

Within the front region 5, a central-front region $\{y<0, z_1<z<z_2\}$ encloses an integer number $M_F$ of front heat exchangers 7, $M_F$ front blade rows 8, and $M_F$ front quick-connect manifolds 9. Along the z direction, the front blade rows 8 are interleaved with the front heat exchangers 7. A front quick-connect manifold 9, which supplies the blade row 8 immediately thereabove with cooling liquid for direct-liquid cooling, is located on the −y side of each front heat exchanger 7. Each front blade row 8 comprises an integer number $N_F$ of front blades 10, which are arrayed along the x direction. Each front blade 10 is a package, generally having the shape of a rectangular parallelepiped, that contains front heat-producing components 11. The heat generated by the heat-producing components 11 is generally the result of Joule heating encountered in electrical circuits.

Similarly, within the rear region 6, a central-ear region $\{y>0, z_1<z<z_2\}$ encloses an integer number $M_R$ of rear heat exchangers 12, $M_R$ rear blade rows 13, and $M_R$ rear quick-connect manifolds 14. Along the z direction, the rear blade rows 13 are interleaved with the rear heat exchangers 12. The interleaved ordering of rear blade rows 13 and rear heat exchangers 12 is opposite to that of front blade rows 8 and front heat exchangers 7; that is, where the z-wise order of front heat exchangers 7 and front blade rows 8 (from bottom to top) is 7-8-7-8-7-8-7-8 as shown in the drawings, then the z-wise order of rear heat exchangers 12 and rear blade rows 13 (from bottom to top) is 13-12-13-12-13-12-13-12. One of the rear quick-connect manifolds 14 is located on the +y side of each rear heat exchanger 12. Each rear blade row 13 comprises an integer number $N_R$ of rear blades 15 that contain rear heat-producing components 16.

Although front blade rows 8 are illustrated as being identical to rear blade rows 13, and front heat exchangers 7 are illustrated as being identical to rear heat exchangers 12, it is possible to accommodate dissimilar blade rows and heat exchangers, provided that the heat exchanger immediately downstream of each blade row is sized appropriately to remove the heat load thereof. Moreover, although $M_F=N_F=4$ is shown, other values of $M_F$ and $N_F$, which may not be necessarily equal, are within the scope of the disclosure. Likewise, although $M_R=N_R=4$ is shown, other values of $M_R$ and $N_R$, not necessarily equal, are also applicable. Furthermore, although the z-wise orders 7-8-7-8-7-8-7-8 and 13-12-13-12-13-12-13-12 are shown in the front region 5 and rear region 6 respectively, the opposite orders, 8-7-8-7-8-7-8-7 and 12-13-12-13-12-13-12-13, are also possible. In addition, z-wise arrangements using fewer heat exchangers, such as 8-8-7-8-8-7 and 12-13-13-12-13-13, are also contemplated.

Each front blade 10 and each rear blade 15 is electrically connected to a midplane (17, 18), which is an electrical circuit card upstanding in the xz plane, and whose function resides in providing electrical power to, and electrical communication between, the blades that are connected thereto. The enclosure 1 may contain one or more midplanes, although one large midplane is often preferred so as to provide connectivity between as many blades as possible. However, because the maximum size of circuit cards may be limited by logistics of manufacturability, two or more midplanes may exist in the enclosure 1. As an example, FIG. 2B shows two midplanes, a lower midplane 17 and an upper midplane 18. In this case, with four rows of front blades ($M_F=4$) and four rows of rear blades ($M_R=4$), all front blades 10 in the lower two front blade rows 8 connect to the −y surface of the lower midplane 17 via front midplane connectors 19, and all rear blades 15 in the lower two rear blade rows 13 connect to the +y surface of the lower midplane 17 via rear midplane connectors 20. Likewise, all front blades 10 in the upper two front blade rows 8 connect to the −y surface of the upper midplane 18 via front midplane connector 19, and all rear blades 15 in the upper two rear blade rows 13 connect to the +y surface of the upper midplane 18 via rear midplane connectors 20 where at least one connector is provided for each blade, but multiple connectors could also be used for each blade.

In general, although not necessarily, the front heat-producing components 11 may be divided into two types: low-power-density front heat-producing components 21 and high-power-density front heat-producing components 22. Similarly, the rear heat-producing components 16 may be divided into low-power-density rear heat-producing components 27 and high-power-density rear heat-producing components 28. A low-power-density heat-producing component may be defined, for example, as having a worst-case surface heat flux less than P; a high-power-density heat-producing component may then be defined as having a worst-case surface heat flux that exceeds P, where as typical value of P may be 75 W/cm$^2$. Although, in FIG. 2B, high-power-density components 22, 28 are shown only at the centers of the blades in the y direction, the invention is not restricted thereto; in general, low-power-density components 21, 27 and high-power-density components 22, 28 may be located anywhere within the three-dimensional volume occupied by front blades 10 or rear blades 15. Furthermore, classification of a component as "low-power-density" or "high-power-density" depends largely on the distribution of heat generation therewithin, because not only the peak heat flux P at a "hotspot", but also the physical size of the hotspot, must be considered. Moreover, P also depends on the highest permissible temperature $T_{max}$ of a component: the lower the required value of $T_{max}$, the lower the definition of P must be.

The represented prototype embodiment uses mockup heat-producing components, such as resistors and thermal test chips, instead of real heat-producing components such as processor and memory chips. In order to monitor the temperature of the mockup heat-producing components, over 11,000 temperature sensors are placed near selected components throughout the prototype enclosure 1. Power dissipation of the mockup low-power-density heat-producing components is 1744 watts per blade; power dissipation of the mockup high-power-density components is 800 watts per blade. The prototype enclosure has space for 32 blades, as shown in FIGS. 2A and 2B, and thus can accommodate a total enclosure power of 81 kW, which far exceeds the capabilities of conventional equipment enclosures. The plan-form power density of the prototype embodiment is 81 kW/13.3 ft$^2 \approx$6 kW/ft$^2$. This far exceeds the power density of typical data centers, which are designed to be cooled by the use of circulating air.

For the two types of heat-producing components, the present invention provides two different cooling solutions; namely, closed-loop liquid-assisted air cooling for low-power-density components 21, 27, and direct-liquid cooling for high-power-density components 22, 28.

Referring to FIG. 1, closed-loop liquid-assisted air-cooling employs a closed loop 23 of circulating air that is confined within the enclosure 1. The closed loop 23 comprises a front airflow segment 24 flowing towards +z in the central-front region (y<0; $z_1$<z<$z_2$) of the enclosure 1, a top airflow segment 25 flowing towards +y in a top region {z>$z_2$} of the enclosure, a rear airflow segment 26 flowing towards −z in the central-rear region (y>0; $z_1$<z<$z_2$) of the enclosure, and a bottom airflow segment 27 flowing towards −y in a bottom region {z<$z_1$} of the enclosure 1.

As air flows along the front airflow segment 24, it is alternately cooled by one of the front heat exchangers 7 and then heated by one of the front blade rows 8; this cooling-and-heating cycle occurs $M_F$ times along the front airflow segment 24. Similarly, as air flows along the rear airflow segment 26, it is alternately heated by one of the rear blade rows 13 and then cooled by one of the rear heat exchangers 12; with this heating-and-cooling cycle occurring $M_R$ times along the rear airflow segment 26. Thus, along the front airflow segment 24, each adjacent combination of front heat exchanger 7, front blade row 8, and front quick-connect manifold 9 represents a thermally neutral front unit 28; whereby on average, each streamline of air in the front airflow segment is cooled by one of the heat exchangers from a temperature $T_2$ to a lower temperature $T_1$, but is then reheated by the following front blade row from temperature $T_1$ to the original temperature $T_2$. Likewise, each combination of rear heat exchanger 12, rear blade row 13, and rear quick-connect manifold 14 represents a thermally neutral rear unit 29. Because the aforesaid z-wise order 7-8-7-8-7-8-7 of front heat exchangers 7 and front blade rows 8 is arranged opposite to the z-wise order 13-12-13-12-13-12-13-12 of rear heat exchangers 12 and rear blade rows 13, the desired, alternating order of heat exchangers and blade rows is maintained, in the air-stream direction, as the air moves (at the top of the enclosure 1) from the front region 5 to the rear region 6, and conversely as it moves (at the bottom of the enclosure 1) from back to front.

In FIG. 1, this closed loop 23 is depicted diagrammatically as the rectangle that is delineated by an upper-front airflow corner 30, an upper-rear airflow corner 31, a lower-rear airflow corner 32, and a lower-front airflow corner 33. Movement of air along the closed air loop 23 is driven by an upper air-moving assembly 34 (FIGS. 2A and 2B) that comprises an integral number $K_U$ of upper fans, such as 35, 36, 37, 38 located in a top-front region {y<0; z>$Z_2$} of the enclosure 1, as well as by a lower air-moving assembly 39 that comprises an integral number $K_L$ of lower fans such as 40, 41, 42, 43, located in a bottom-rear region {y>0; z<$z_1$} of the enclosure 1. In the prototype embodiment shown in FIG. 1 and FIGS. 2A and 2B, the number of upper fans in the first air-moving assembly 34 is $K_U$=4; likewise, the number of lower fans in the second air-moving assembly 39 is $K_L$=4. In such an embodiment, the closed air path 23, shown schematically in FIG. 1 as the single rectangle (30, 31, 32, 33), is more accurately represented, as shown in FIGS. 2A and 2B, as two concentric rectangles; namely, an inner rectangle 44 and an outer rectangle 45. The inner rectangle 44 represents air driven by the pair of top-inner fans (37,38) and the pair of bottom-inner fans (42, 43). The outer rectangle 45 represents air driven by the pair of upper-outer fans (35, 36) and the pair of lower-outer fans (40, 41). It should be emphasized that, notwithstanding this illustration of the airflow as one discrete loop 23 or as two discrete loops 44 and 45, in actuality an infinite number of parallel streamlines flow along such closed paths, bathing the entire volume occupied by the blade rows (8, 13), the heat exchangers (7, 12), and the air-moving assemblies (34, 39) in the air stream.

Other arrangements of air movers are also within the scope of the invention. For example, arrays of axial-flow fans may be interleaved between blade cages and heat exchangers so as to replace or supplement the air-moving power of the shown centrifugal fans.

In the closed loop 23, the only empty spaces needed for air plenums are a top-rear region 46 {y>0; z>$z_2$} and a bottom-front region 47 {y>0; z<$z_2$}. Consequently, no floor space is lost along the sides or front and back of the rack for air distribution, because there are no air plenums that extend vertically in the enclosure. Thus, except for the space occupied by the external walls or doors 2, the full "foot-print" of the rack is available for electronics, which are contained in the blades (10, 15).

Air in the closed loop 23 increases in temperature from a cool temperature $T_1$ to a warm temperature $T_2$ as it flows through each blade row (8. 13), because the air convectively absorbs heat dissipated by the low-power-density components 21, 27 (as shown in FIG. 2B) therein. However, the heated air is immediately restored to the cool temperature $T_1$ as it flows through the heat exchanger (7, 12) that immediately follows the blade row in the air-stream direction. Thus, each adjacent combination of front heat exchanger 7 and front blade row 8 is thermally neutral for the air. Consequently, in traversing through the closed loop 23, the air is heated and cooled $M_F + M_R$ times, with no net change in temperature being encountered during steady-state operation.

The heat exchangers 7 and 12 are air-to-liquid heat exchangers in whose liquid side is circulated an air-assisting liquid 48. All heat dissipated by the low-power-density components is removed from the enclosure 1 by the air-assisting liquid 48, which is typically, but not necessarily, water that communicates with an external chilled-water system (not shown). This chilled-water system must provide, by means well known in the art, reasonably-clean, non-corrosive, above-dew-point water for use in the heat exchangers (7, 12). Clean water is required to prevent heat-exchanger fouling (which can compromise heat-transfer performance); non-corrosive water is required to prevent corrosion of metal plumbing; and above-dew-point water is desired to avoid water in the air from condensing on the surfaces of the heat-exchangers.

For direct-liquid cooling of the high-power-density heat-producing components 22, 28, a direct-cooling liquid 49 is conveyed thereto in a manner described below, whence the components' heat load is primarily transferred directly to the direct-cooling liquid 49 by solid-to-solid conduction and solid-to-liquid convection. Thus, virtually all heat dissipated by the high-power-density components is removed from the enclosure 1 by the direct-cooling liquid 49, which is typically water communicating with an external chilled-water system. Again, the chilled-water system must provide, by means well known in the art, filtered, non-corrosive, above-dew-point water for use in direct liquid cooling of the high power density components 22, 28.

Because both types of cooling, i.e., closed-loop liquid-assisted air cooling and direct-liquid cooling, reject heat to liquids within the enclosure 1, the entire enclosure appears to an outside observer to be liquid cooled. Yet in reality, air cooling is used to advantage internally, because the low-power-density components 21, 27, treated with liquid-assisted air cooling, are ordinarily numerous and therefore difficult and expensive to treat with direct-liquid cooling.

In principle, the direct-cooling liquid 49 and the air-assisting liquid 48 may be independent of each other, and may resultingly operate at different temperatures, thereby allowing, for example, very low-temperature high-power-density components (e.g. processors) to be combined with higher-temperature, air-cooled low-power-density components (e.g. memory chips). It is not ordinarily contemplated to have any components at temperature low enough so that condensation forms under typical computer machine room conditions. However, if very or extremely low temperatures are required, the relatively well-sealed volume of air inside the enclosure 1 may be dehumidified by suitable means well known in the art.

Discussed hereinbelow in specific detail are various components and operating aspects of the inventive apparatus employed for implementation of the novel cooling method.

Thermally Neutral Units

The structure of a thermally neutral front unit 28, which comprises one of the front heat exchangers 7, the front blade row 8 directly thereabove, and the front quick-connect manifold 9 directly in front thereof, is described in detail below. The structure of a rear thermally neutral unit, which comprises one of the rear heat exchanger 12, the rear blade row 13 directly therebeneath, and the rear quick-connect manifold 14 directly therebehind, is similar, possibly even identical, except for the inverted z-wise order of components, as discussed previously in connection with FIGS. 2A and 2B.

Figure 2:
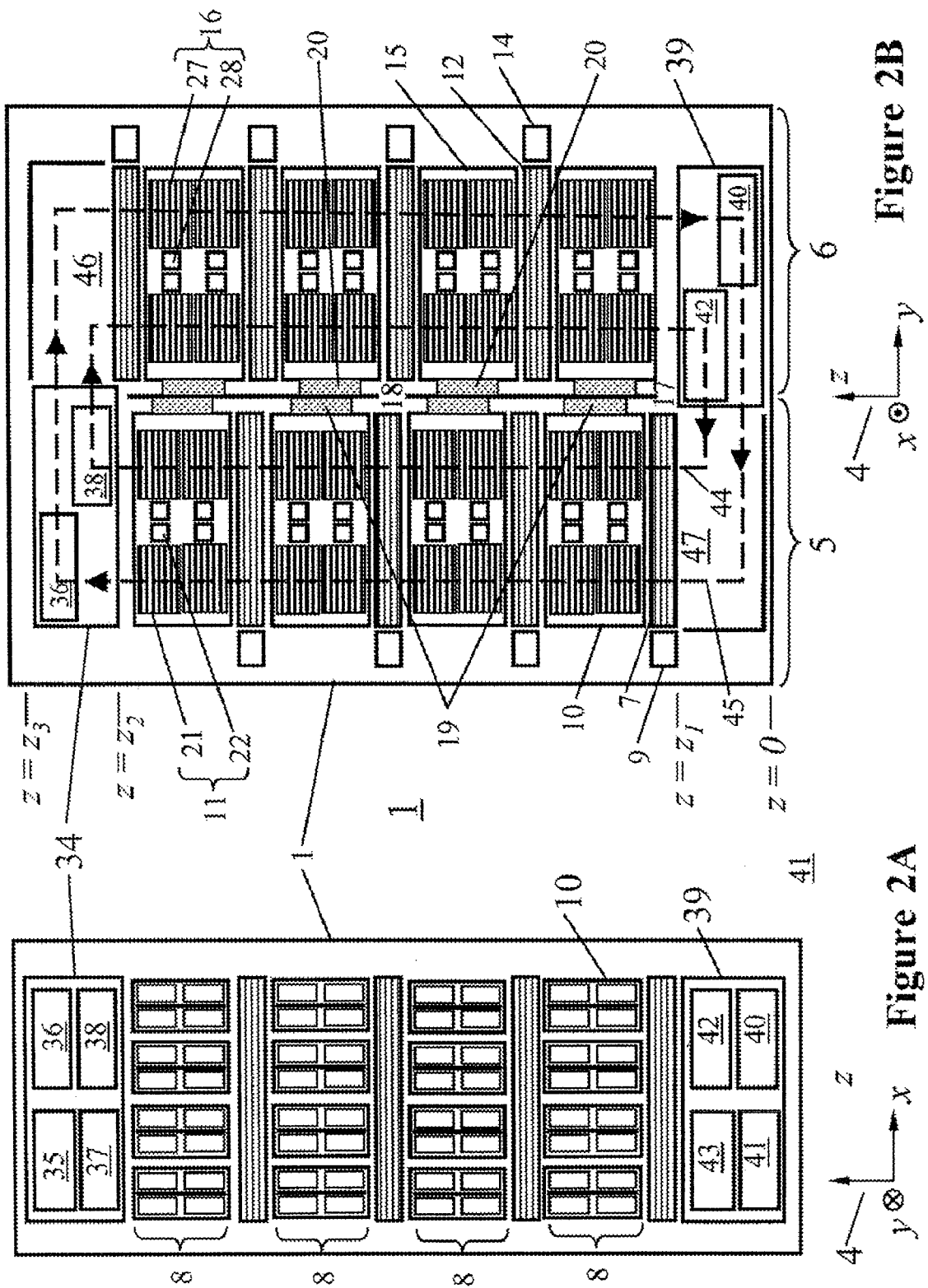
FIGS. 2A and 2B illustrate schematically, respectively front and side views of the embodiment of the enclosure of FIG. 1 and its major interior components.
Figure 3:
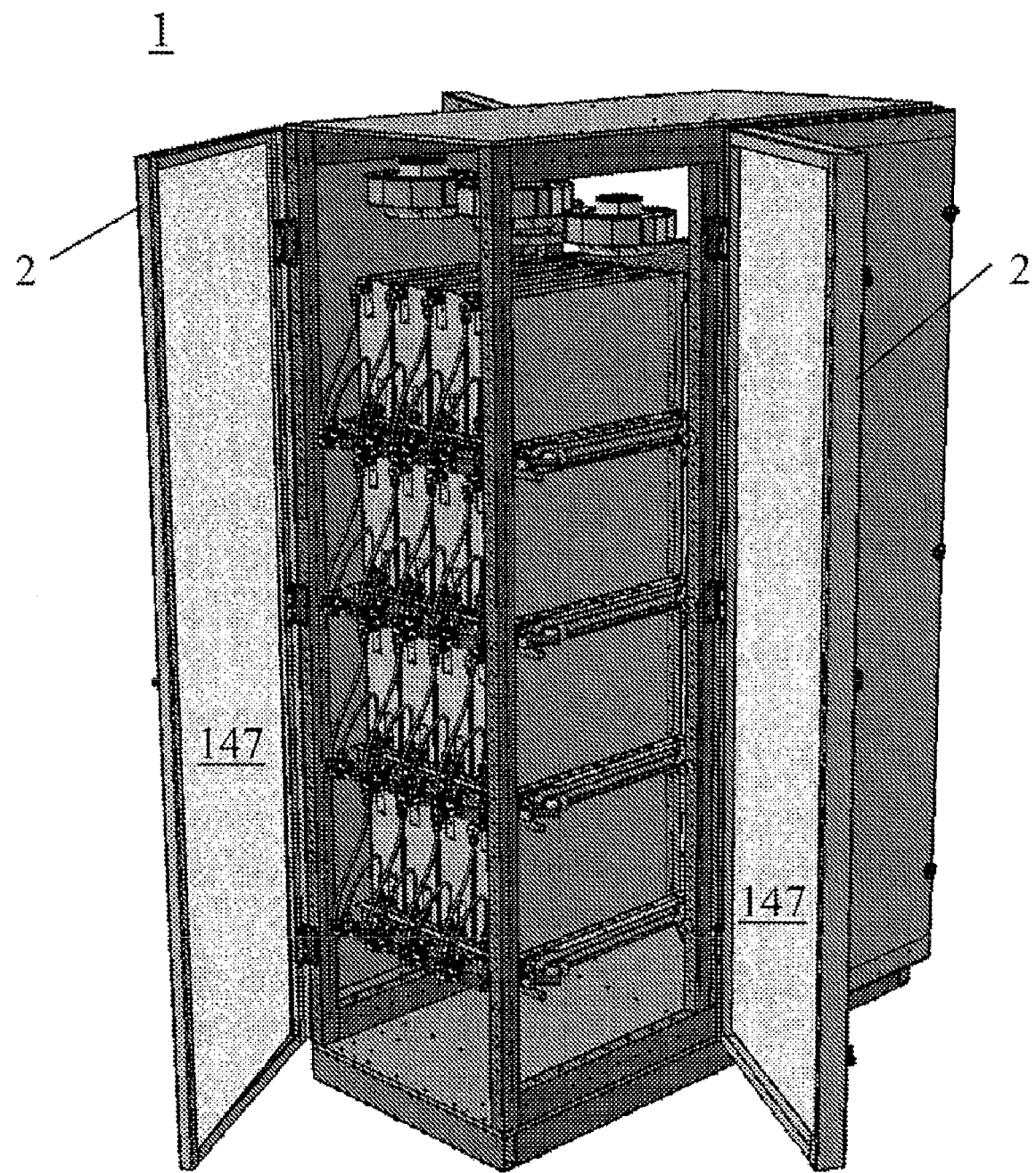
FIG. 3 illustrates a perspective view of the enclosure of FIG. 1 showing the exterior doors thereof.
Figure 4:
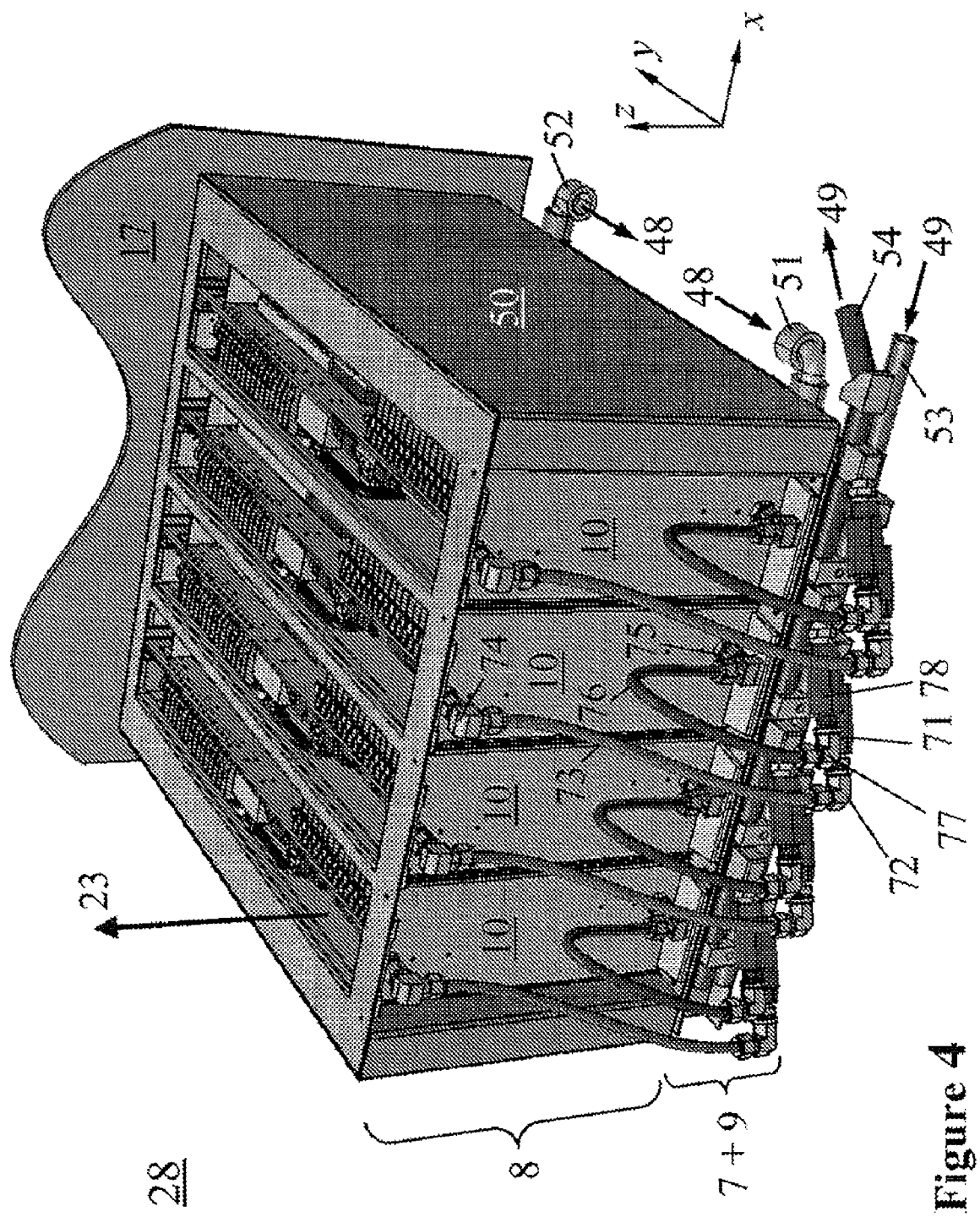
FIG. 4 illustrates a perspective view of a thermally neutral front unit, which is fully equipped with blades.
Figure 5:
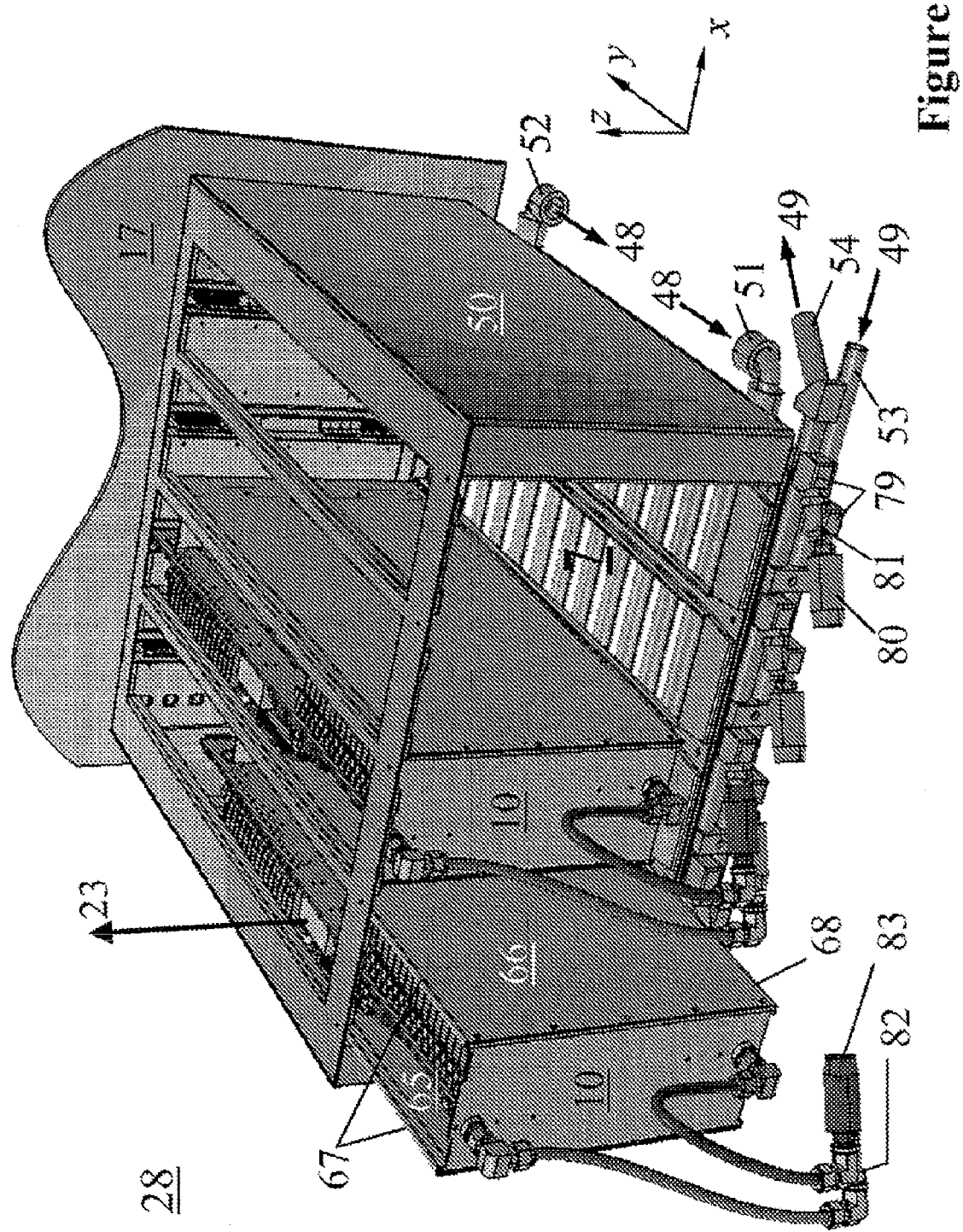
FIG. 5 illustrates a perspective view of the thermally neutral front unit of FIG. 4, shown partially disassembled.

FIGS. 4 and 5 illustrate two views of one of the $M_F$ thermally neutral front units 28, which, for explanatory purposes, is assumed to be the thermally neutral unit at the lower left of FIG. 2B. The front blade row 8 comprises $N_F$ front blades 10 housed together in a front blade cage 50, which mechanically supports the front blades within the enclosure 1, and which locates the blades 10 for slidable connection in the −y direction relative to the midplane 17, to which blades in a rear blade cage (not shown in FIGS. 4 and 5) may also be connected. As shown, the midplane preferably extends in the z direction above this thermally neutral front unit (assumed above to be the lowest in the enclosure 1), so that instead of the midplane being shared only by the lowest horizontal blade rows front and rear, it is shared by more than one horizontal row. For example, FIG. 2 shows lower and upper midplanes (17, 18) that each provide connectivity between four blade rows: two front blade rows 8 and two rear blade rows 13. The midplane 17 may also extend beyond the blade cage 50 in the ±x direction, as shown, to allow space for connections that bring electrical power to the midplane, which in turn distributes power to the front and rear blade rows (8, 13).

In a prototype embodiment, each prototype front blade 10 has dimensions of 120 mm×560 mm×305 mm in the x, y, and z directions, respectively, and each prototype blade cage 50 has xyz dimensions of 573 mm×605 mm×311 mm. Each prototype heat exchanger has dimensions of 540 mm×605 mm×48 mm in the x, y, and z directions, respectively. The prototype thermally neutral units 28 are stacked on a 375-mm pitch in the z direction.

FIG. 4 shows the $N_F$=4 front blades located in the positions they would normally occupy during operation when plugged at right angles into the midplane 17. FIG. 5 shows the leftmost blade disconnected from the midplane and partially withdrawn from the blade cage, thereby illustrating the manner in which a blade is removed from the blade cage for servicing or replacement. FIG. 5 also shows the rightmost two blades omitted, thereby revealing the front air-to-liquid heat exchanger 7 therebeneath.

Arrows in FIGS. 4 and 5 indicate the flow of cooling fluids through the thermally neutral front unit 28. The closed loop 23 of circulating air, which cools the low-power-density components 21, flows in the +z direction. In the prototype embodiment, the volumetric flow rate of air along the closed loop 23 is determined by a detailed scan of measured velocities over a typical blade. The scanned velocities vary between about 3.0 and 5.0 m/s. The average air velocity is 3.4 m/s over the 480 mm×535 mm cross-sectional area of the loop. Integrating the velocity over the cross-sectional area, the total volumetric flow rate along the closed loop 23 is 0.873 m³/s (1850 standard cubic feet per minute). Because the air is cooled by heat exchange to liquid eight times around the prototype-embodiment's closed loop 23, it is to be appreciated that this 1850 CFM is equivalent to 14,800 CFM of conventional air cooling, because the latter does not use multiple heat exchanges from air to liquid. Such a large equivalent flow rate of air is extremely difficult to accomplish (with an enclosure of the size used in the prototype embodiment) by means other than those taught by the present invention.

The air-assisting liquid 48, which cools the closed loop 23 of circulating air before it enters the next blade-row thereabove, enters the heat exchanger 7 through a heat-exchanger supply fitting 51 and exits through a heat-exchanger return fitting 52. In a prototype embodiment, the air-assisting liquid employed is water, with a volumetric flow rate through each heat exchanger of approximately 11.4 liter/minute (3.0 gallons/minute).

Direct-cooling liquid 49, which cools high-power-density components 22, enters the quick-connect manifold 9 through a manifold supply pipe 53 and exits through a manifold return pipe 54. In the prototype embodiment, the direct-cooling liquid is preferably water, with a volumetric flow rate to the quick-connect manifold 9 of approximately 8.0 liters/minute (2.11 gallons/minute), which imparts a flow to each identical blade of 2.0 liters/minute (0.53 gallons/minute).

Blade Cages

Figure 6:
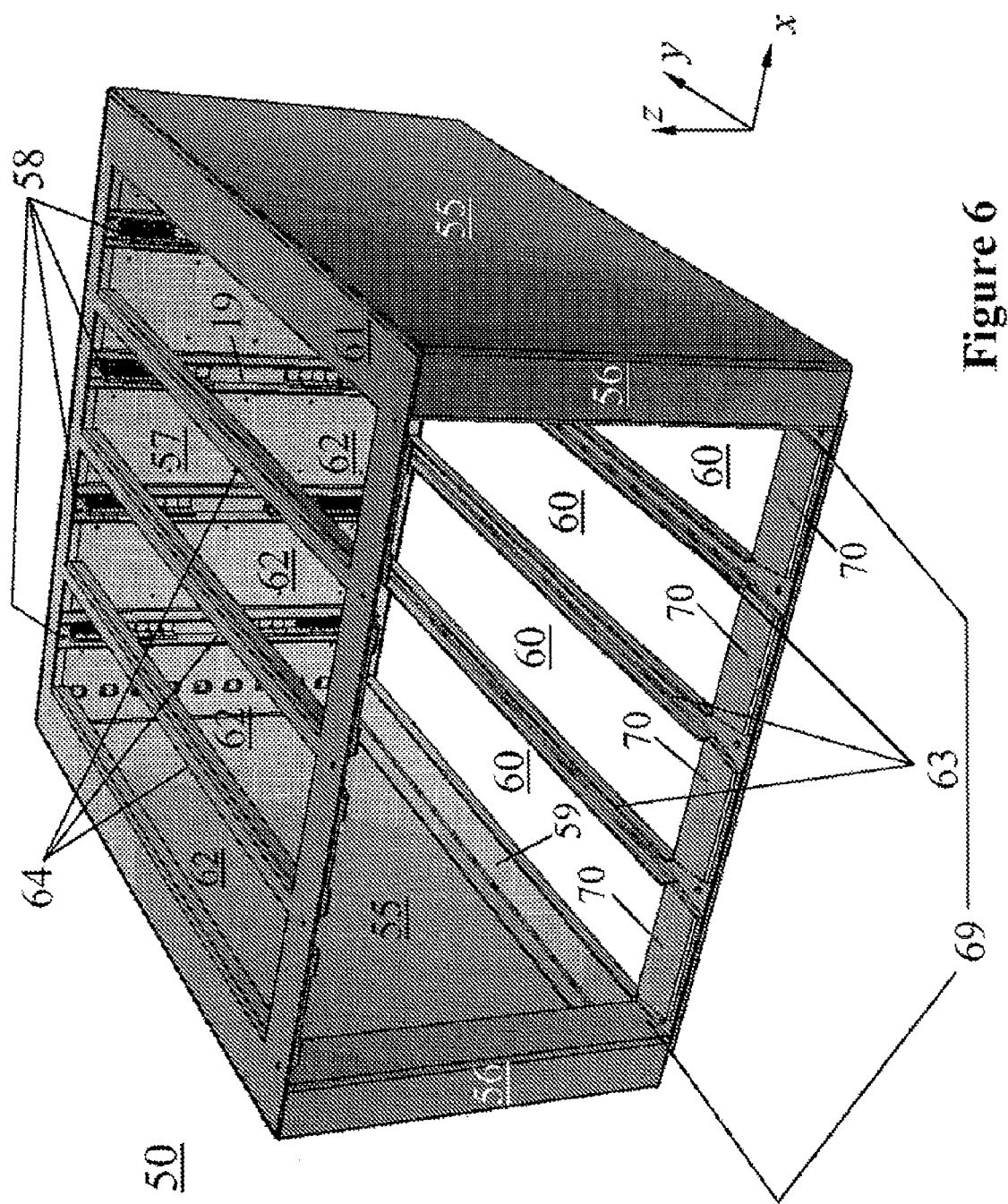
FIG. 6 illustrates a perspective view of a blade cage for the unit of FIG. 4.

FIG. 6 illustrates the front blade cage 50, showing all blades having been removed, thereby revealing its structure as possessing solid side surfaces 55; an open front cage surface 56 to allow insertion of front blades; a slotted rear cage surface 57 with slots 58 to allow connectors near the +y edge of the front blades to mate to the midplane connectors 19 on the front surface of one of the midplanes (17, 18); a bottom cage surface 59 having large rectangular bottom-flow-through holes 60; and a top cage surface 61 having similar, large rectangular top-flow-through holes 62. The bottom flow-through holes 60 and top-flow-through holes 62 together allow for airflow through the front blades in the +z direction. Between the $N_F$ bottom-flow-through holes are ($N_F$–1) bottom blade guides 63 formed from the sheet metal of the bottom cage surface 59. Likewise, between the top-flow-through holes, top blade guides 64 are formed from the sheet metal of the top cage surface 61. Each blade guide (63, 64) has a U-shaped cross section in the xz plane that provides guidance for the blades as they prepare to engage the midplane connectors 19. The U-shaped cross section also imparts considerable stiffness to the guide itself, thereby preventing excessive bending of the bottom guides 63 under the weight of the front blades 10, which bear on the bottom guides as the blades are inserted and removed.

As shown in FIG. 5, each front blade 10 has a left sheet-metal skin 65 on its –x face and a right sheet-metal skin 66 on its +x face. Each of these faces has a hemmed top edge 67 that slides within one of the top blade guides 64 while the blade is being inserted or withdrawn, and a hemmed bottom edge 68 that similarly slides within one of the bottom blade guides 63. Hemming the edges prevents galling the blade guides (63, 64) as the edges slide on them. Each bottom blade guide 63 is wide enough to accept two hemmed bottom edges 68; one belonging to the right sheet-metal skin 66 of the blade to its left, and the other belonging to the left sheet-metal skin 65 of the blade to its right. Likewise, each top blade guide 64 is wide enough to accept two hemmed top edges 67, one from a blade to its left, and another from a blade to its right. As shown in FIG. 6, special guides 69 at the extreme left and right of the blade cage, both top and bottom, are wide enough to accept one hemmed edge only. To assist in aligning the blade in the x direction so that the hemmed edges properly engage the blade guides, tapered starting blocks 70, affixed to the bottom and top cage surfaces (59, 61) are provided between blade guides (63, 64, 69).

Quick-Connect Manifolds

Referring to FIG. 4, the direct-cooling liquid 49 in the manifold supply pipe 53 is supplied to one of the blades 10, for example the second blade from the right in FIG. 4, by flowing first through a supply quick connect 71 that is attached (for the purpose of minimizing the y dimension of the enclosure 1) at an acute angle to the manifold supply pipe 53, then through a manifold-supply elbow fitting 72, thereafter through a flexible supply hose 73, and finally through a blade-supply elbow fitting 74. If it is desired to balance flow between various blades, a control valve may be inserted between each flexible supply hose 73 and the corresponding blade-supply elbow fitting 74. In a prototype embodiment, needle valves, such as sold under the registered trademark "SWAGELOK", Model SS-IR56, may be used for this purpose. Flow of the direct-cooling liquid 49 through the blade itself is described hereinbelow. The direct-cooling liquid is returned from the blade to the manifold return pipe 54 by flowing first through a blade-return elbow fitting 75, then through a flexible return hose 76, then through a manifold-return elbow fitting 77, and finally through a return quick connect 78. The flexible supply hose 73 and flexible return hose 76 must be flexible to permit operation of the supply quick connect 71 and the return quick connect 78. For example, 85 durometer polyurethane hose may be suitable for hoses 73, 76. In the prototype embodiment, 6.35-mm-I.D., 9.53-mm-O.D. hose of this type is used, with "SWAGELOK", Model SS-IR56 (reg. TM) connections.

A quick-connect, well known in the art, is a two-piece plumbing connection that provides rapid, easy, virtually dripless connection and disconnection of a fluid line. The two pieces are referred to as "body" and "stem"; the body is the larger (female) half of the connection; the stem is the smaller (male) half. Each piece has a shut-off valve, whereby when the two halves are disconnected with fluid flowing in the line, the flow is automatically stopped in both disconnected halves of the line. When the two halves are re-connected, the flow automatically restarts. Such convenient disconnection and reconnection are essential to the equipment in this invention, inasmuch as the equipment is prone to occasional failure, and thus requires occasional servicing or replacement. Although high-quality quick connects are quite reliable and virtually dripless, the supply and return quick connects 71, 78 in the preferred embodiment are located, as shown in FIG. 4, in front of the blades, with no electronic components located directly therebeneath. Such a location is preferred to avoid any possibility of direct-cooling liquid 49 dripping onto the electronics.

As shown by the empty blade positions in FIG. 5, the manifold supply pipe has attached thereto, at $N_F$ locations (one for each of the $N_F$ blades in the blade row), an angle block 79 and a quick-connect supply body 80. The angle block is designed to orient the quick connects 71, 78 at an acute angle to the manifold pipes 53, 54, rather than at a right angle, in order to minimize the y dimension of the enclosure 1. Similarly, the manifold return pipe 54 has attached thereto, at $N_F$ locations, one of the angle blocks 79 and a quick-connect return stem 81. Each blade 10 has a quick-connect supply stem 82 (seen more clearly in FIG. 10) that leads to the supply hose 73 and a quick-connect return body 83 that leads to the return hose 76. One of the blades 10 may be quickly connected to the flow of direct-cooling liquid 49 by connecting the blade's quick-connect supply stem 82 to the manifold's quick-connect supply body 80, and by also connecting the blade's quick-connect return body 83 to the manifold's quick-connect return stem 81. The connections are arranged this way, with supply and return connections having opposite genders, to avoid any possibility of erroneous connection. In a prototype embodiment, the quick-connect bodies and stems may be of the type sold under the registered trademark "SWAGELOK" Models SS-QTM2A-B-4PM and QTM2-D-4PM, respectively.

Heat Exchangers

Figure 7:
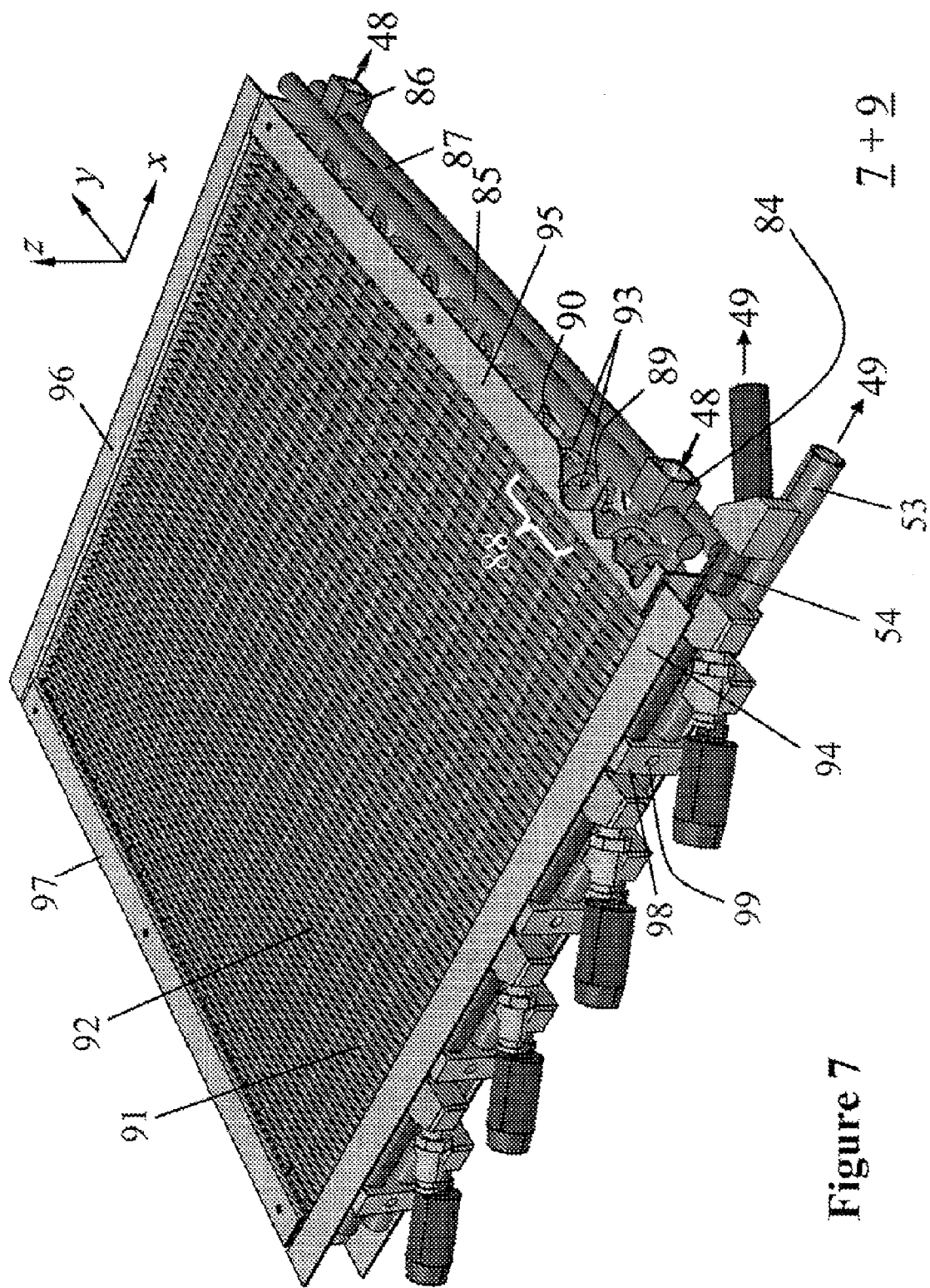
FIG. 7 illustrates a perspective view of a heat exchanger and quick-connect manifold.

In a prototype embodiment, the front heat exchangers 7 and rear heat exchangers 12 are identical; details of such a heat exchanger, as well as the quick-connect manifold 9 attached thereto, are shown in FIG. 7. The construction of this device, known as a copper-tube, aluminum-fin air-to-liquid heat exchanger, is well known in the art of heat-exchanger fabrication. It comprises a copper supply fitting 84 that supplies the air-assisting liquid 48 from an external chilled-liquid system (not shown) to a copper-pipe supply header 85, and a copper return fitting 86 that returns the air-assisting liquid 48 from a copper-pipe return header 87 to the chilled-liquid system. In the heat exchanger, flow of the air-assisting liquid occurs through an integer number $N_C$ of copper piping circuits 88 that in parallel convey the air-assisting liquid from the supply header 85 to the return header 87. One end of each piping circuit 88 is connected to the supply header 85 by a supply feeder 89; the other end of each piping circuit is connected to the return header 87 by a return feeder 90. Each piping circuit 88 comprises an integer number $N_P$ of straight copper pipes 91 that extend back and forth along the +x and −x directions through tight holes in finely spaced aluminum fins 92. The $N_P$ straight copper pipes are connected at their ends by $N_P−1$ U-turn copper fittings 93, thereby to form a continuous meandering path from supply header to return header. All along this meandering path, the air-assisting liquid 48 absorbs heat; heat is transferred first by convection from hot air in the closed air loop 23 to the aluminum fins 92 and straight copper pipes 91, then by conduction through the aluminum fins 92 and the straight copper pipes 91, and finally by convection from the interior of the copper pipes to the air-assisting liquid 48 within the tubes. Surrounding the finned area of the heat exchanger 7 is a four-sided C-channel frame 94, 95, 96, 97 whose right side 95 is shown partially cutaway in FIG. 7 in order to reveal the piping circuits 88. Holes in the frame sides 95, 97 support the piping circuits.

In the prototype embodiment, the number of piping circuits 88 is $N_C=7$, the number of passes per circuit is $N_P=6$, the outer diameter of copper pipes in piping circuits 88 is 9.5 mm, the outer diameter of the header pipes (85, 87) is 16 mm, the fins 92 are 0.1 mm thick on 1.5 mm centers, and the height of each fin in the z direction is 44 mm. The finned area of the heat exchanger covers the fill cross-sectional area of the front blade row 8 that it must cool; for the prototype embodiment, the x and y dimensions of this area are 480 mm and 530 mm, respectively.

A space-saving advantage of the prototype embodiment resides in that the quick-connect manifold 9 nestles inside the C-channel-frame's front member 94, being attached thereto by means of scalloped clamps 98 that cradle the manifold supply and return pipes 53, 54. The front half of each clamp, visible in FIG. 7, cradles the front surfaces of the pipes 53, 54; while the rear half of each clamp, not visible in FIG. 7, cradles the rear surfaces of the pipes. The rear half of each clamp is affixed to the C-channel-frame's front member 94. To secure the pipes 53, 54 to the front member 94, the front and rear halves of each clamp 98 are pulled together by a screw that passes through a hole 99 in the front half of the scalloped clamp, passes between the two pipes 53, 54, and engages a threaded hole in the rear half of the scalloped clamp.

Plumbing Connections for Heat Exchangers

Figure 8:
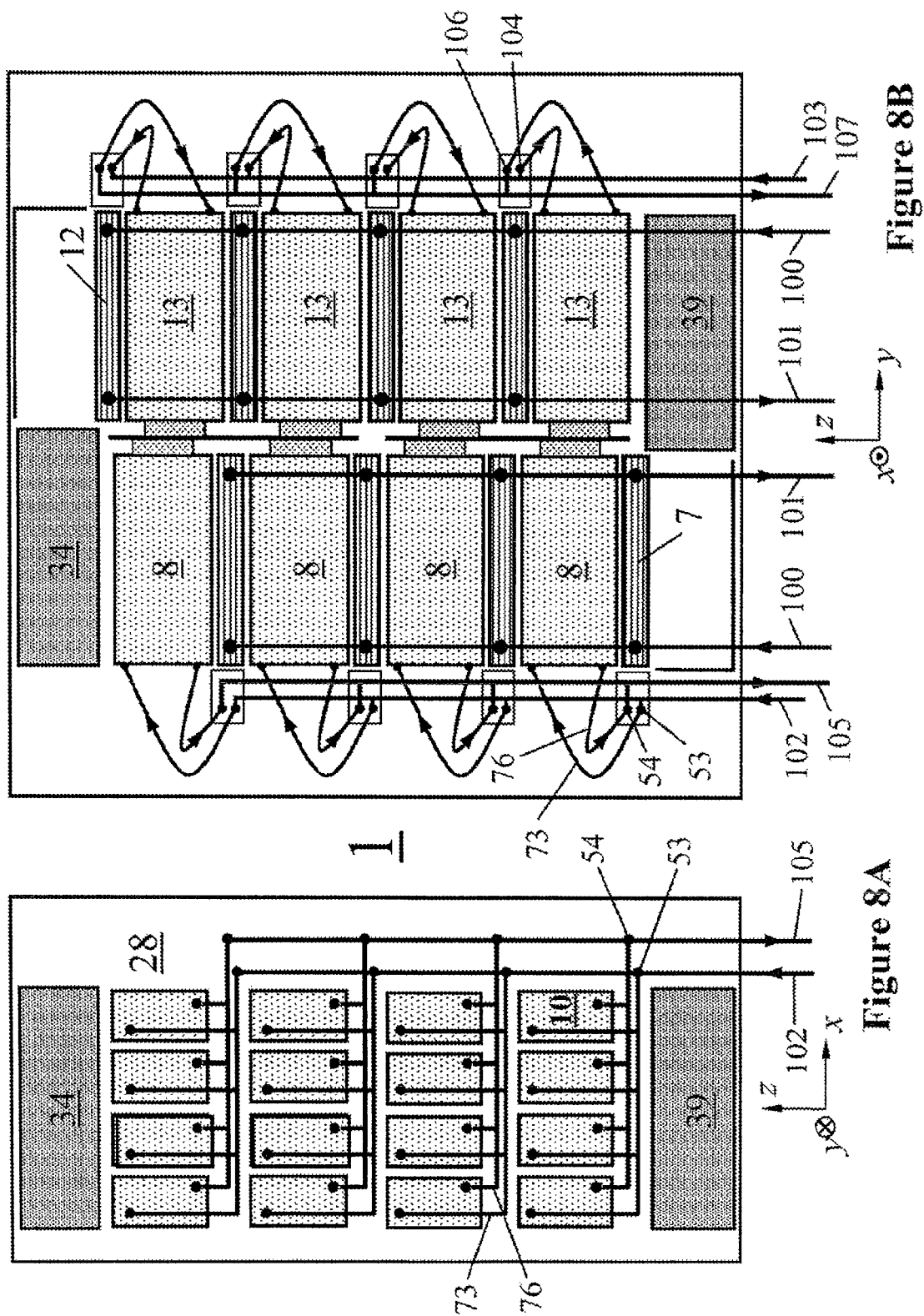
FIGS. 8A and 8B illustrate, respectively schematic front and side views showing the enclosure-level plumbing.
Figure 9:
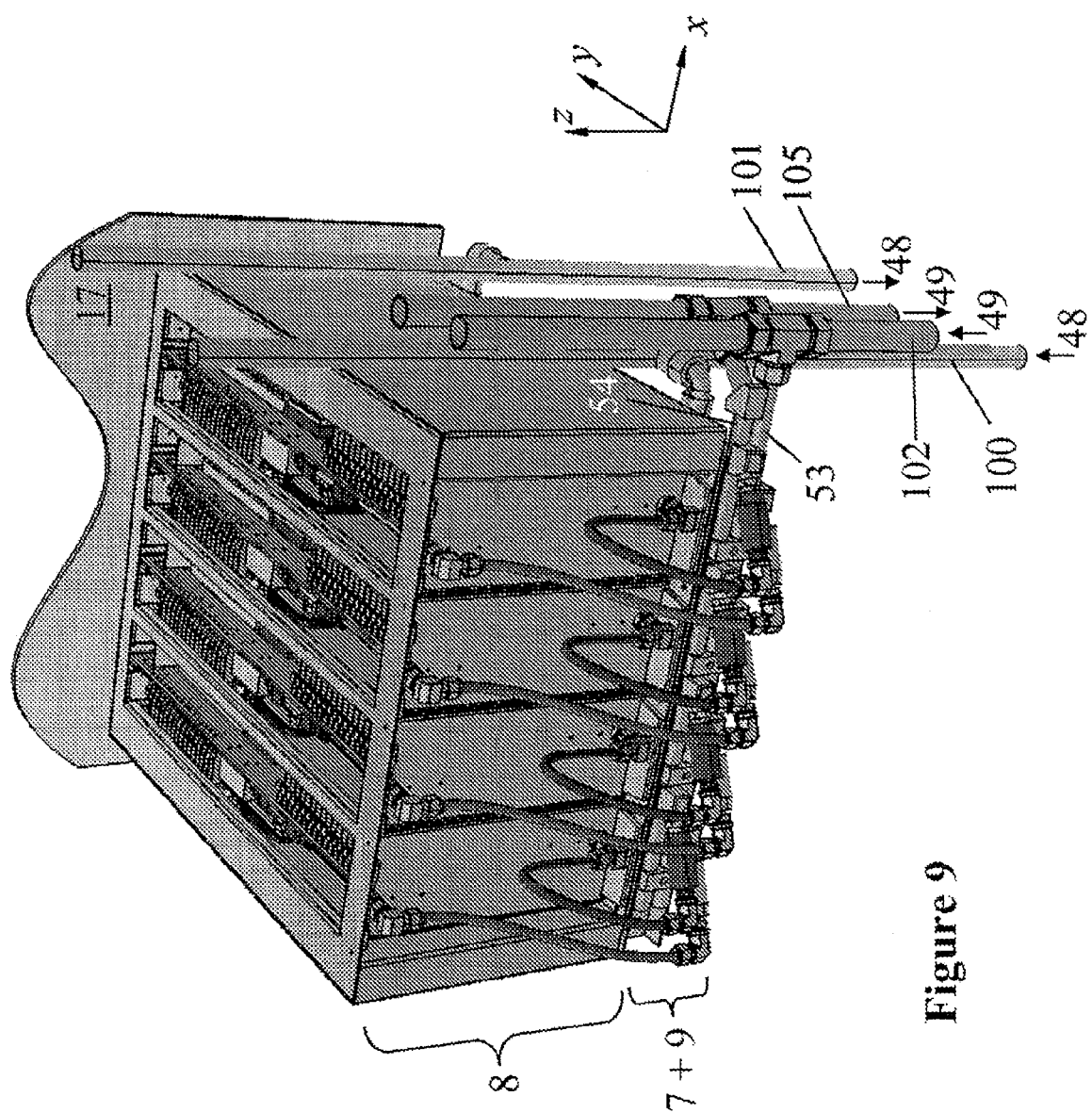
FIG. 9 illustrates a perspective view of a thermally neutral front unit showing the enclosure-level plumbing of FIGS. 8A and 8B.

The heat-exchanger's supply header 85 is connected to a heat-exchanger supply riser 100, shown schematically in FIG. 8 and pictorially in FIG. 9, that supplies the air-assisting liquid 48 from a first chilled-liquid system (not shown) at a supply temperature $T_{S1}$ to an entire column of heat exchangers, which are connected in parallel. If the first chilled-liquid system is a chilled-water system, as is well known in the art, then the temperature of water in the heat-exchanger supply riser 100 is typically $T_{S1}=18$ to 20° C.in order to be safely above the dew-point temperature of typical computer-room environments.

The heat exchanger's return header 87 is connected to a heat-exchanger return riser 101, shown schematically in FIG. 8 and pictorially in FIG. 9, that returns the air-assisting liquid 48 from an entire column of heat exchangers, connected in parallel, to the chilled-liquid system. This return water has been warmed to a return temperature $T_{R1}$ by absorption of heat from the closed air loop 23. If the chilled-liquid system is a typical chilled-water system, the typical return temperature is $T_{R1}=25\text{-}27°$ C., such that the temperature rise $T_{R1}-T_{S1}$ of the water across the heat exchanger is typically within a preferable range of about 5-10° C., predicated on the disclosed system.

In a prototype embodiment, the heat load of the low-power-density components per front blade row 8 is experimentally about 5.4 kW to 6.9 kW. This heat load is adequately cooled by one of the prototype heat exchangers 7 when it carries a flow rate of approximately 11.4 liter/min (3.0 gallon/min) of the air-assisting liquid 48.

Plumbing Connections for Quick-Connect Manifolds

Referring to the schematic FIG. 8 and the pictorial representation in FIG. 9, a front quick-connect supply riser 102 supplies the direct-cooling liquid 49 from a second chilled-liquid system (not shown), at a supply temperature $T_{S2}$, to $M_F$ front quick-connect-manifold supply pipes 53, one of which belongs to each of the $M_F$ front quick-connect manifolds 9. Likewise, a rear quick-connect supply riser 103 supplies the direct-cooling liquid 49 from the second chilled-liquid system, at the supply temperature $T_{S2}$, to $M_R$ rear quick-connect-manifold supply pipes 104, one of which belongs to each of the $M_R$ rear quick-connect manifolds 14. If the second chilled-liquid system is a chilled-water system, as is well known in the art, then the temperature of water in the quick-connect supply risers 102, 103 is typically $T_{S2}=18$ to 20° C. in order to be safely above the dew-point temperature of typical computer-room environments.

Still referring to the schematic FIG. 8 and the pictorial FIG. 9, $M_F$ front quick-connect-manifold return pipes 54 (one per front quick-connect manifold) return the direct-cooling liquid 49 to a front quick-connect return riser 105, and thence to the return side of the second chilled-liquid system. Similarly, $M_R$ rear quick-connect manifold return pipes 106 (one per rear quick-connect manifold) return the direct-cooling liquid 49 to a rear quick-connect return riser 107, and thence to the return side of the second chilled-liquid system. Because the direct-cooling liquid has absorbed, from the front and rear blades, the heat that was dissipated by the high-power-density components therein, the return water has a temperature $T_{R2}$ that is higher than $T_{F2}$. If the second chilled-liquid system is a chilled-water system, as is well known in the art, then the temperature of water in the quick-connect return risers 105 is typically $T_{R2}=25$ to 27° C.; that is, the flow rate through the manifolds is typically adjusted to produce a water-temperature rise, $\Delta T = T_{R2} - T_{S2}$, of about 5-10° C.

Prototype Blade

Figure 10:
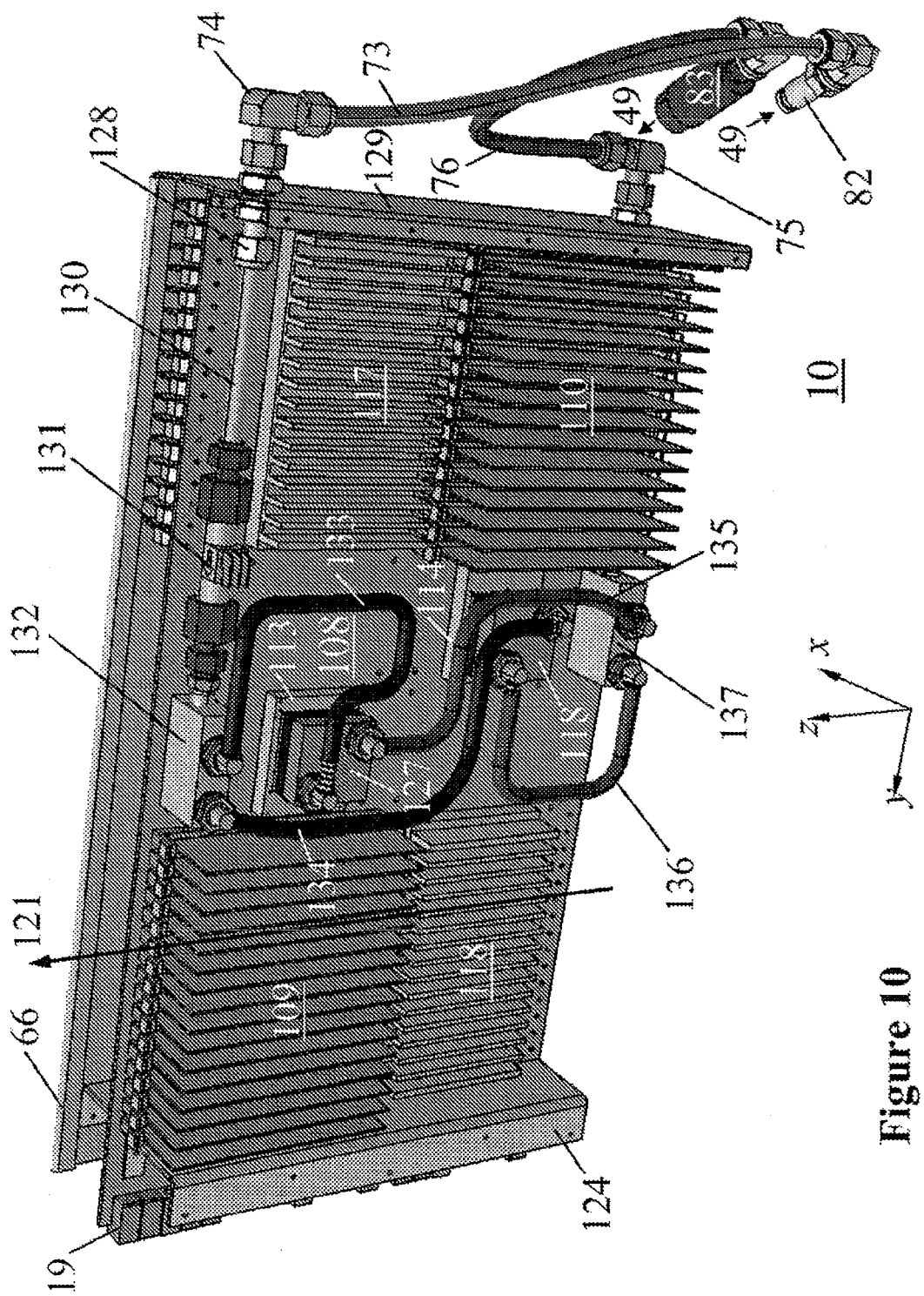
FIG. 10 illustrates a perspective view of a left-side view of a prototype blade.
Figure 11:
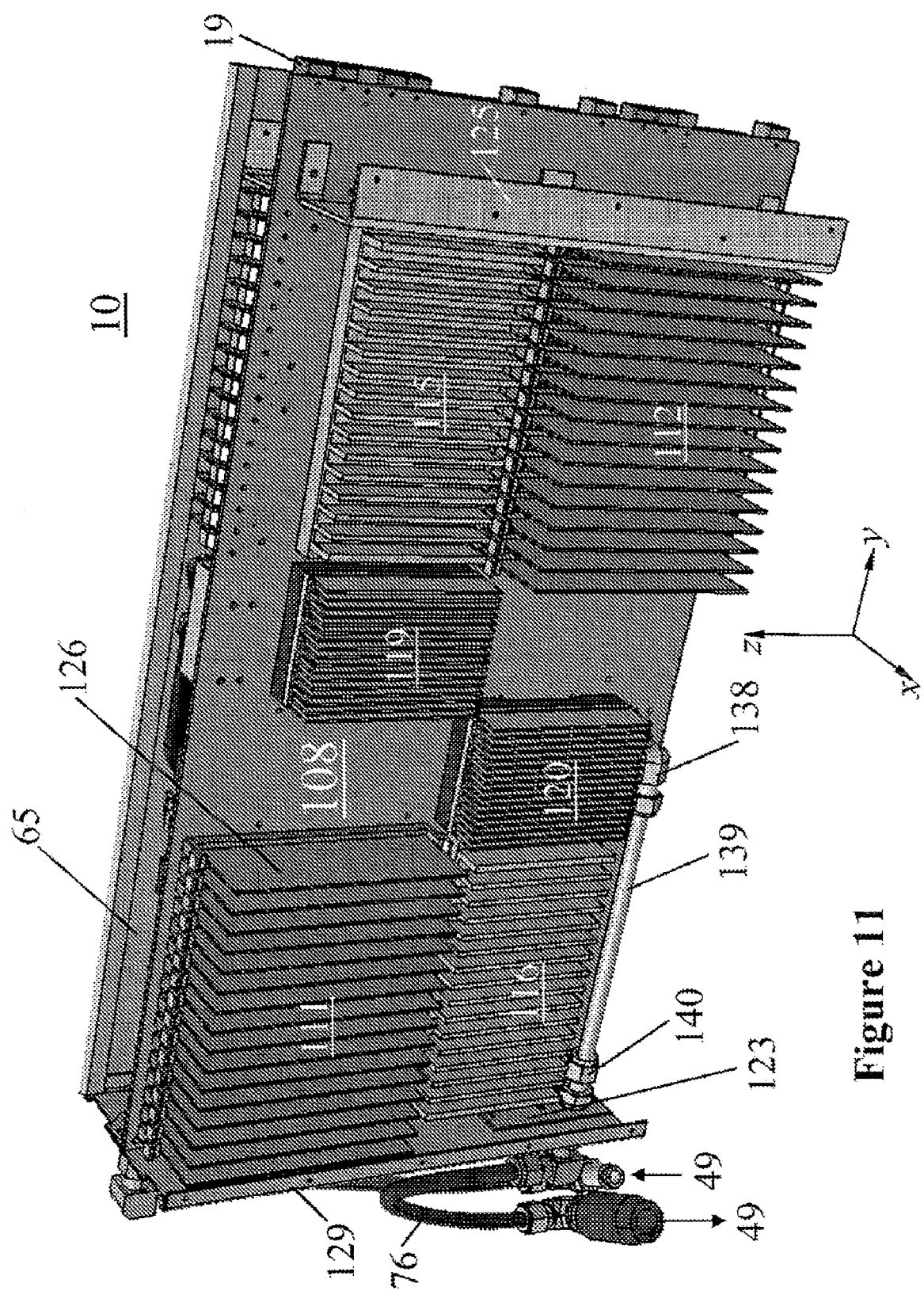
FIG. 11 illustrates a perspective view of a right-side view of the prototype blade.

One of the front blades 10 used in the prototype embodiment is illustrated in FIG. 10 and in FIG. 11. FIG. 10 shows the blade from the −x direction, whereas FIG. 11 shows the blade from the +x direction. In order to display the blade's internal structure, its left sheet-metal skin 65 is hidden in FIG. 10, whereas its right sheet-metal skin 66 is hidden in FIG. 11. From the description above, it is evident that the particular structure of this blade is merely an example of the type of equipment that may be cooled in accordance with the invention; in general, the invention applies regardless of the locations of the low-power-density and high-power-density heat-producing devices within the volume of the blades. Nevertheless, the blade structure described herein has several advantages, as elucidated hereinbelow.

The blade comprises a blade circuit card 108 having a front surface facing the −x direction (shown in FIG. 10) and a rear surface facing the +x direction (shown in FIG. 11). At the +y edge of the blade circuit card 108, the midplane connectors 19 are electrically connected thereto. Also electrically connected to the blade circuit card 108 are four types of heat-producing components: first, four groups of DIMMs ("Dual-In-Line Memory Modules"), a standard format for carrying computer-memory chips, including an upper-front DIMM array 109, a lower-front DIMM array 110, an upper-rear DIMM array 111, and a lower-rear DIMM array 112; second, two processor modules, including an upper processor module 113 and a lower processor module 114; third, four DIMM-power converters, including an upper-front DIMM-power converter 115, a lower-front DIMM power converter 116, an upper-rear DIMM power converter 117, and a lower-rear DIMM power converter 118; and fourth, two processor-power converters, including an upper processor power converter 119 and a lower processor power converter 120. Note that the power converters 115-118 include finned heat sinks, which are visible in FIGS. 10 & 11 and which obscure the active electronic components used for power conversion that are mounted to circuit card 108. Of all these heat-producing components, only the processor modules (113, 114) are high-power-density, direct-liquid cooled components; all of the others are low-power-density, air-cooled components.

Each "power-converter" component 115-120 delivers low-voltage, high-amperage power to the DIMM array 109-112 or to the processor module 113, 114 that lies directly opposite on the other side of the blade circuit card 108. For example, the upper-front DIMM power converter 115 (FIG. 11) delivers power to the upper-front DIMM array 109 (FIG. 10); the lower-rear DIMM-power converter 118 delivers power to the lower-rear DIMM array 112. Likewise, the upper-processor power converter 119 delivers power to the upper processor module 113, and the lower-processor power converter 120 delivers power to the lower processor module 114. This arrangement, in which each power converter lies directly opposite the component it powers, produces very short electrical paths from the power converters to their respective loads, thereby providing a low-loss means of delivering the low-voltage, high-amperage power, and representing an advantage of this invention.

An additional advantage of this invention resides in that the DIMM arrays 109-112 are arranged such that, in traversing a blade, no streamline of air passes through more than one DIMM array, thereby preventing overheated air that would lead to poor cooling of components furthest downstream. For example (FIG. 10), on its path through the blade, an air streamline 121 passes through the lower-rear DIMM power converter 118 and then through the upper-front DIMM array 109. Because the DIMM power converter 118 dissipates only about 18% as much heat as the lower-rear DIMM array 112 that it powers, the arrangement of DIMMs shown is, from a cooling viewpoint, far superior to an alternative arrangement having all DIMM arrays 109-112 on one side of the blade circuit card 108 and all DIMM power converters 115-118 on the other side, because in that case, some air streamlines would pass trough two DIMM arrays.

Figure 12:
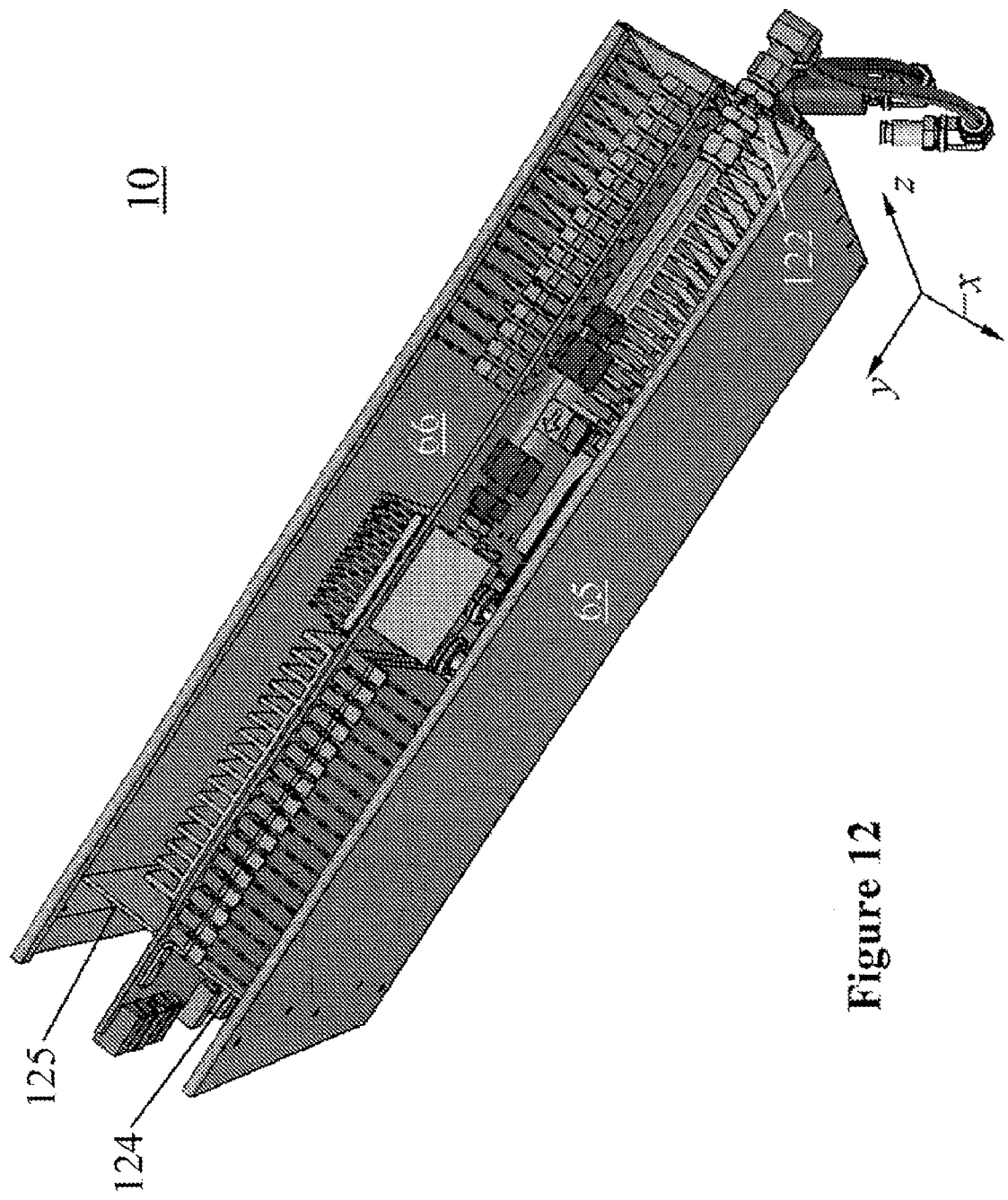
FIG. 12 illustrates a perspective view of a top view of the prototype blade.

Both of the advantages cited above, i.e., short electrical paths for power delivery and efficient DIMM arrangement to avoid overheated air, derive from components being placed on both sides of the blade circuit card 108. This is possible only if the blade circuit card stands in a plane parallel to yz which lies, as shown in FIG. 12, midway between the blade's left sheet-metal skin 65 and its right sheet-metal skin 66. This must be done while maintaining the −z and +z faces of the blade open so as to allow for a vertical airflow. Referring to FIG. 11 and FIG. 12, these requirements are met by suspending the blade circuit card 108 and its components from an upper angle bracket 122 and a lower angle bracket 123 that are attached to a tailstock 129, and from a left U-channel strut 124 and a right U-channel strut 125 that are attached to the left sheet-metal skin 65 and the right sheet-metal skin 66, respectively.

Referring to FIGS. 10 and 11, in the prototype embodiment, each air-cooled DIMM array 109-112 comprises 16 double-high DIMMs 126 on 11-mm centers. Prototype DIMM cards are thermal mockups, containing simple resistors to generate heat, rather than real DRAM and hub chips. Each mockup DIMM dissipates either 20 W or 26 W of heat, depending on its configuration, so that each DIMM array 109-112 dissipates about 320 W (with 20 W DIMMs) or 416 W (with 26 W DIMMs). Air-cooled DIMM power converters 115-118 and processor power-converters 119-120, which typically dissipate only 18% as much heat as the devices they power, are not simulated thermally in the prototype embodiment. However, each prototype blade has, near the midplane connectors 19, additional air-cooled heat-producing components (not shown in the Figures) that dissipate 80 W. Thus the total air-cooled heat dissipation per prototype blade is (4)(320)+80=1360 W (with 20 W DIMMs) or (4)(416)+80=1744 W (with 26 W DIMMs). In order to measure the thermal performance of the prototype embodiment, over 11,000 temperature sensors are located near heat-producing components on the mockup DIMM cards throughout the prototype enclosure 1. With 1360 air-cooled watts per blade, and water entering the heat exchangers 7 at 15° C. (slightly lower than the range 18-20° C. suggested hereinabove, because humidity in the prototype's laboratory environment is controlled such that 15° C. is well above dew point), the highest temperature measured by these sensors is 56° C. With 1744 air-cooled watts per blade, the highest air-cooled-component temperature measured is 71° C. The highest temperatures are typically located near the downstream edges of DIMM cards, where ambient air is warmest due to heating thereof by components upstream.

In the prototype embodiment, each mockup processor module contains an 18.5×18.5 mm silicon heater chip dissipating 350 W of heat, yielding an average power density of 1.02 W/mm². This heat is removed by the direct-cooling liquid 49 that flows in a processor cooling head 127 (FIG. 10). For the prototype embodiment, the direct-cooling liquid is water, which enters the cooling head 127 at 10° C. (lower than the range 18-20° C. suggested hereinabove, because humidity in the prototype's laboratory environment is controlled such that 10° C. is above dew point). The prototype cooling head, a silicon-microchannel cooler, is attached to the silicon chip in such a way as to remove the chip's heat efficiently, in order to maintain the chip at the lowest possible temperature. Thermal sensors integrated into the silicon heater chip illustrate that, with water flowing at 1 liter/min through the cooling head, the maximum temperature on the silicon chip is about 35° C. This represents a total thermal resistance (chip to inlet water) of 0.07° C./W. Using the chip area given above, this is equivalent to an area-normalized thermal resistance of 24° C./(W/mm$^2$). In an alternative embodiment, the prototype blades are populated with heater chips generating 96 W (0.28 W/mm$^2$) that are air cooled by Heatlane™ heatsink technology. This air-cooled solution provides a total thermal resistance of 0.27° C./W, which is equivalent to an area-normalized resistance of 92° C./(W/mm$^2$). Thus, the direct-water-cooled solution has nearly four times the cooling capability of the air-cooled solution.

Referring to FIG. 10, the direct-cooling liquid 49 which cools the processor modules enters the blade through the supply hose 73 and blade-supply elbow fitting 74, as previously described, thereafter to a feed-through supply fitting 128 that passes through a hole in the blade tailstock 129, then to a blade supply pipe 130, then to a flow meter 131 which verifies that an adequate flow of direct-cooling liquid is present before power is applied to the processor modules 113-114 and finally to a blade-supply manifold 132 that feeds two hoses, including an upper-processor supply hose 133 and a lower-processor supply hose 134, which convey the direct-cooling liquid 49 to the cooling heads 127 that cool the upper processor module 113 and lower processor module 114. After passing through the cooling heads 127, the direct-cooling liquid flows through an upper-processor return hose 135 and a lower-processor return hose 136, whose flows are combined in a blade-return manifold 137. Referring now to FIG. 11, the blade-return manifold 137 discharges this flow to a return elbow fitting 138 that passes through a hole in the blade circuit card 108 and delivers the flow to a blade return pipe 139, from there to a return feed-through fitting 140 that passes through a hole in the blade tailstock 129, then to the blade return elbow fitting 75, and finally to the return hose 76.

Air Movers

The air-moving assemblies 34, 39 are now described in more specific detail, along with related issues such as acoustic insulation, sealing, flow control, and fan failure.

Each of the fans 35-38 and 40-43 driving the closed-loop airflow 23 is preferably of the type known as a "centrifugal fan" or "blower", because such fans naturally cause the air to turn a right-angle corner. Thus, if the upper fans 35-38 are of the centrifugal type, they naturally cause the air to turn at the upper-front airflow corner 30 (FIG. 1); similarly, if the lower fans 40-43 are centrifugal, they naturally cause the air to turn at the lower-rear airflow corner 32.

Figure 13:
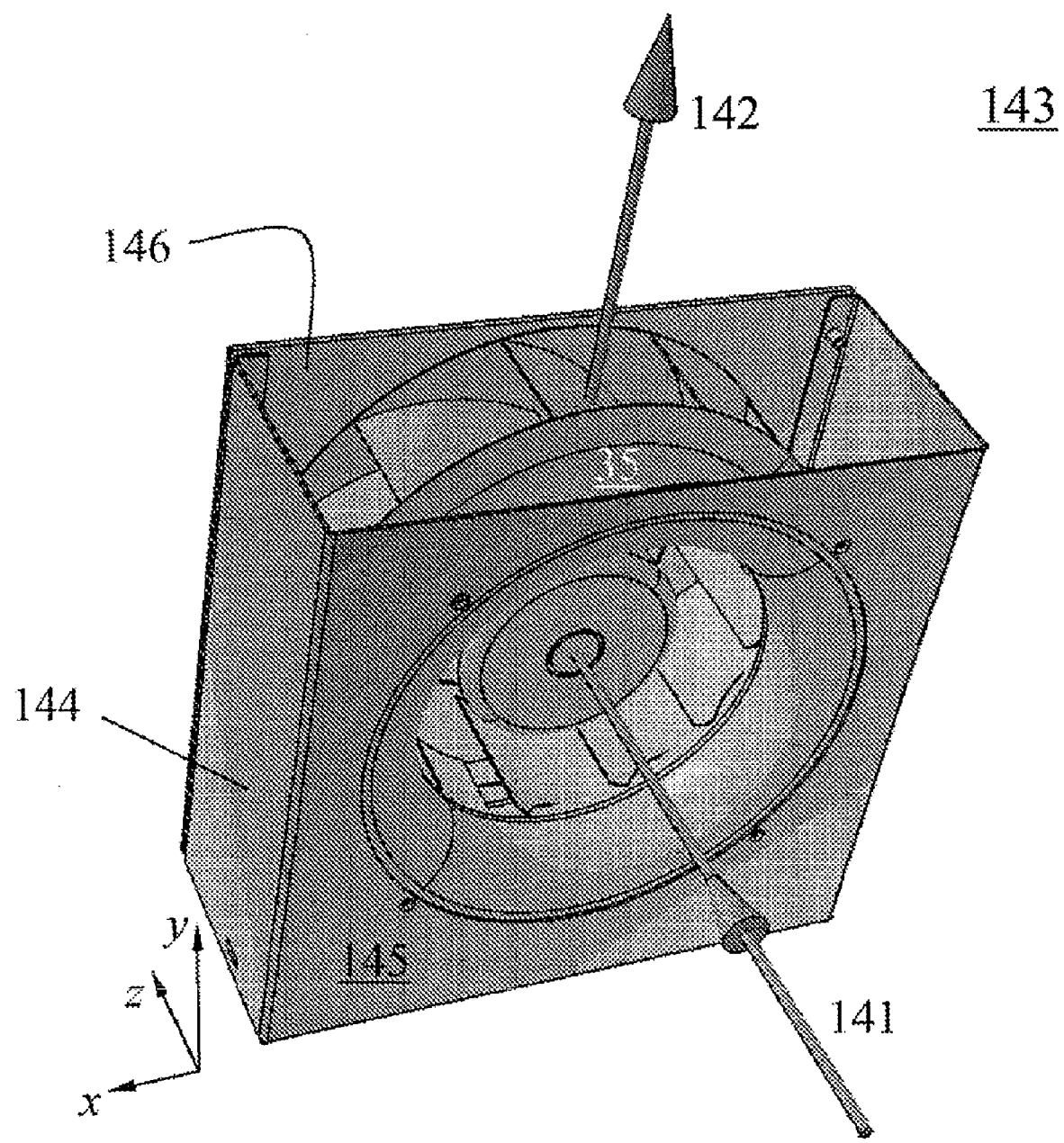
FIG. 13 illustrates a perspective view of a bottom and rear view of a fan, shown with a box.

Referring to FIG. 13 and assuming the use of centrifugal fans, each of the upper fans 35-38 has an axis of rotation that is parallel to the z-axis, an intake air-stream 141 flowing toward +z, and an exhaust air-stream flowing 142 flowing toward +y. The latter flow direction is achieved by a fan-and-housing assembly 143, as shown in FIG. 13, wherein each upper fan 35-38 is enclosed in a housing 144 having two open sides; i.e., an intake side 145 facing −z and an exhaust side 146 facing +y. Similarly, each of the lower fans 40-43 has an axis of rotation that is extended in parallel with the z axis, an air-intake direction pointing toward −z, and an air-exhaust direction pointing toward −y. The latter is achieved (assuming that upper and lower fans are identical) by the fan-and-housing assembly 144, which for the lower fans is oriented so that the open intake side 145 faces −z and the open exhaust side 146 faces −y. In other words, if lower fans and upper fans are identical, then a lower fan 40-43 in its housing 144 is merely an upside down version of an upper fan 35-38 in its housing 144.

Because the air loop 23 is closed, the noise created by the moving air, and in particular the noise created by the fans 35-38 and 40-43, may be acoustically isolated inside the enclosure 1, thereby minimizing annoyance to nearby personnel, and protecting their hearing. In contrast, acoustical isolation is much more difficult to achieve for conventional enclosures where the air used for air cooling therewithin flows across the enclosure boundary to the outside. Improved acoustic isolation is thus a key advantage of the present invention. Acoustic isolation of the fan and air noise within the enclosure 1 is readily accomplished by lining all inside surfaces of its outer shell, especially walls and doors 2, with a layer 147 of an acoustic insulation, as shown in FIG. 3. This insulation should preferably be of the type known as a "transmission-loss material", which attenuates the transmission of acoustic energy therethrough. A transmission-loss material is primarily characterized by its mass, the greater the mass per unit area of the layer, the greater the attenuation. In a prototype embodiment of this invention, the acoustic insulation used was a 1"-thick (25.4-mm-thick) layer of SOUNDMAT (registered trademark) PB material, which is a self-adhesive transmission-loss material, made by SoundCoat corporation, that includes a "barrier layer" (transmission-loss layer) having an areal density of 1 lb/ft$^2$ (4.88 N/m$^2$).

Referring again to FIGS. 1, 2A and 2B, the top-rear region 46 {y>0; z>z$_2$} of the enclosure 1 contains only air, thereby providing a high-pressure plenum in which the closed air loop 23 turns the upper-rear airflow corner 31, the air being driven to execute this turn because of the favorable pressure gradient created in the −z direction by the low-pressure intake of the lower fans 40-43. Likewise, a bottom-front region 47 of the enclosure 10 contains only air, thereby providing a high-pressure plenum in which the closed air loop 23 turns the lower-front airflow corner 33, the air being driven to execute this turn because of the favorable pressure gradient created in the +z direction by the low-pressure intake of the upper fans 35-38.

Figure 14:
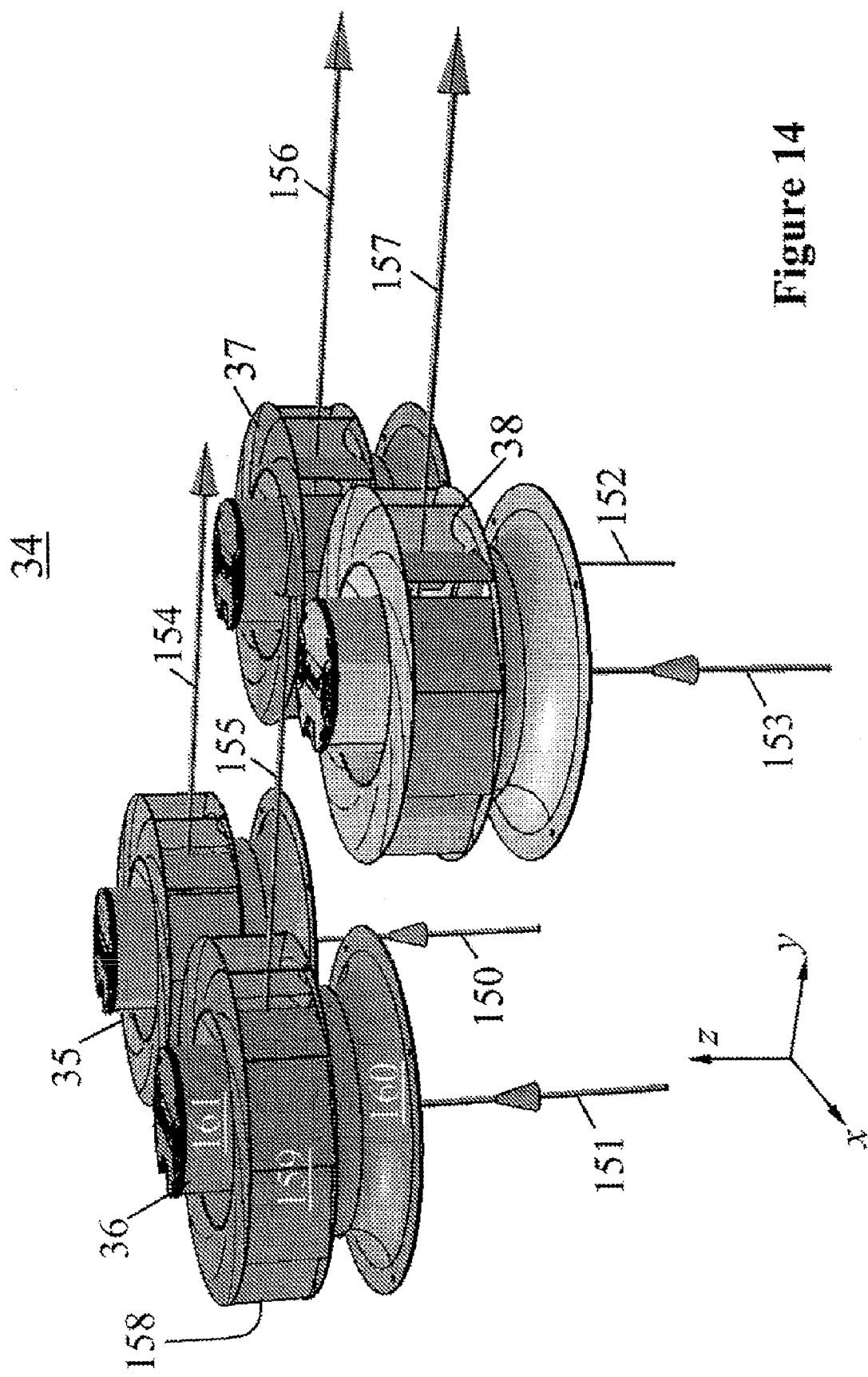
FIG. 14 illustrates a perspective view of four fans, shown without boxes.

The fans in each air-moving assembly (34, 39) are arranged so that their air streams do not substantially interfere. This is achieved by placing the fans in an over-and-under, fore-and-aft arrangement shown in FIG. 14, which depicts, without fan housings 144, the upper fans (35-38) of the upper air-moving assembly 34. Because of the fore-and aft arrangement, outer-intake airstreams 150 and 151 of the outer fans (35, 36) do not interfere with inner-intake airstreams 152 and 153 of the inner fans (37, 38). Also, because of the over-and-under arrangement, outer-exhaust airstreams 154 and 155 of the outer fans (35, 36) do not interfere and with inner-exhaust airstreams 156 and 157 of the inner fans (37, 38).

In the prototype embodiment, all fans (upper fans 35-38 and lower fans 40-43) are preferably backward-curved centrifugal fans having a 250-mm-diameter rotating wheel 158 comprising eleven backward-curved blades 159. The pressure-flow performance of each such fan is enhanced with a flared inlet ring 160, which guides air smoothly into the fan. When such an inlet ring is used, space in the z direction may be saved, as shown, by packaging the fans so that the wheel 158 of each inner fan 37, 38 partially overlaps (in the z direction) the inlet ring 160 of the corresponding outer fan 35, 36. The rotating wheel 158 is attached to the armature of a motor whose stator 161 is affixed to the housing 144.

Figure 15:
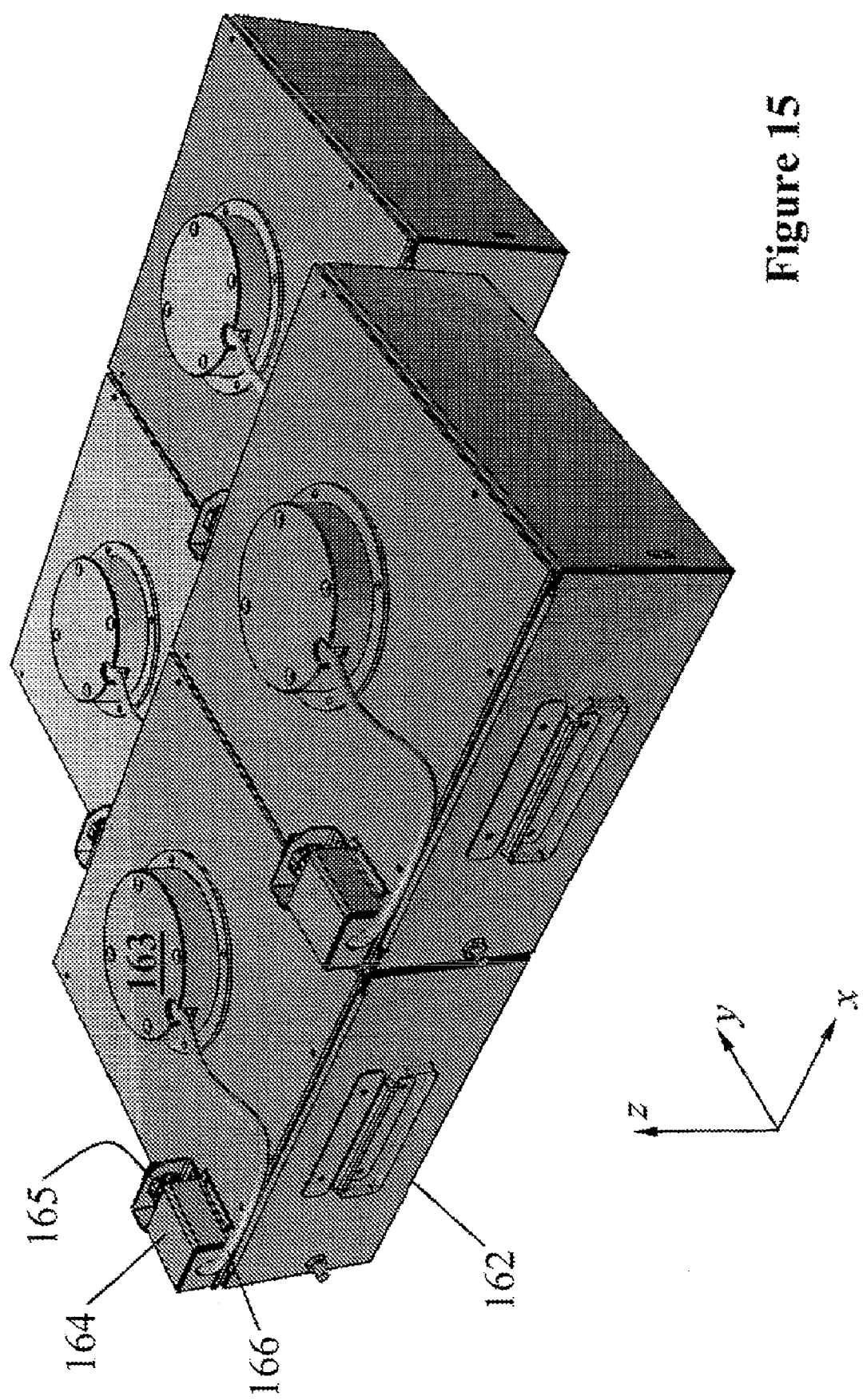
FIG. 15 illustrates a perspective view of the four fans, shown with boxes.

FIG. 15 shows four of the fan-and-housing assemblies 143 arranged in the aforesaid over-and-under, fore-and-aft configuration. Each housing 144 comprises a sheet-metal box 162 whose −z and +y faces are open (as shown previously in FIG. 13), a top-hat-shaped flange 163 into which the stator 161 nestles and to which it is affixed, and a connector assembly 164 on whose +y face is located a male fan connector 165 that provides, via a local fan cable 166, for connection of electrical power to the fan's motor, as well as connection of electrical signals from the fan's tachometer.

Figure 16:
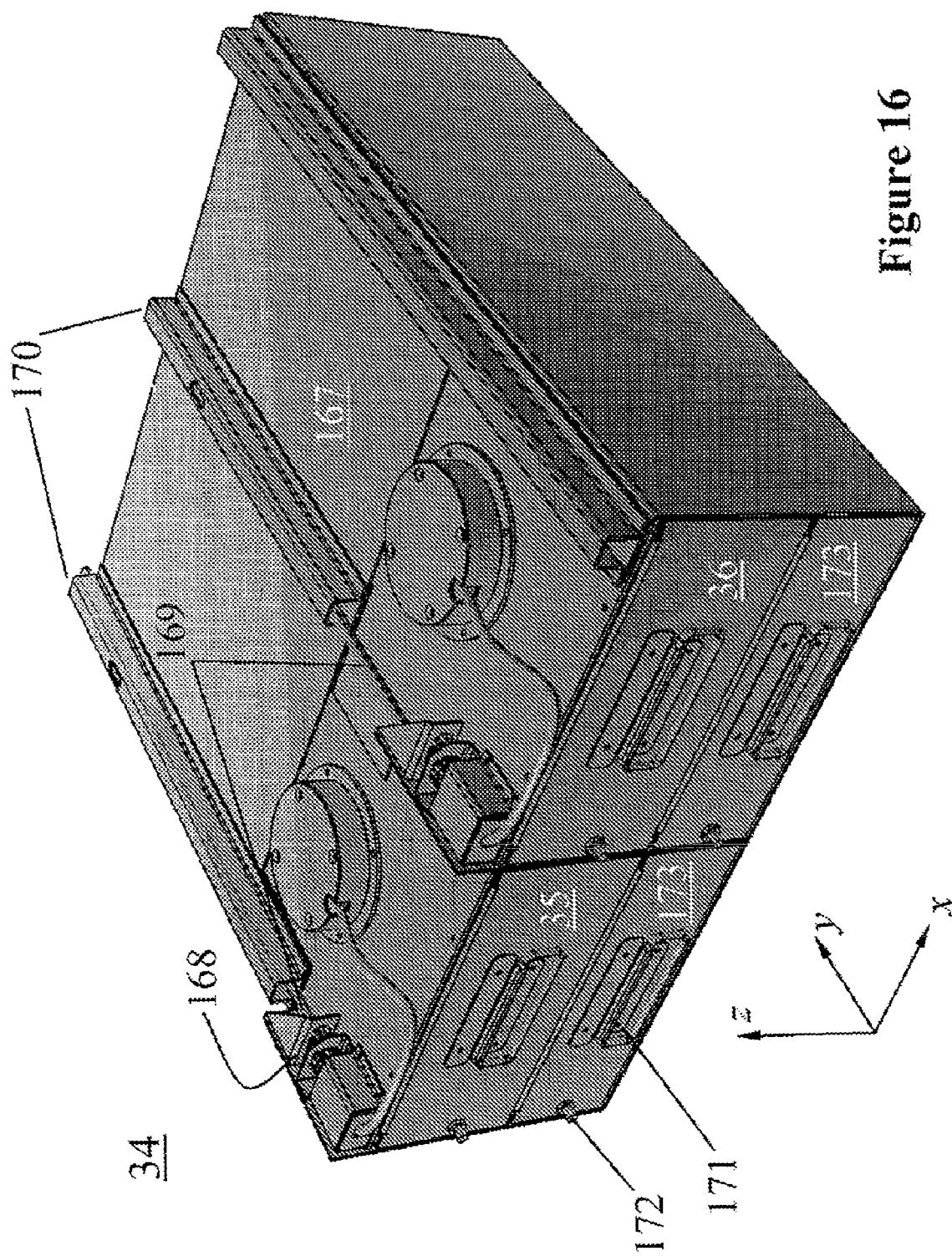
FIG. 16 illustrates a perspective view of a front view of an air-moving assembly.
Figure 17:
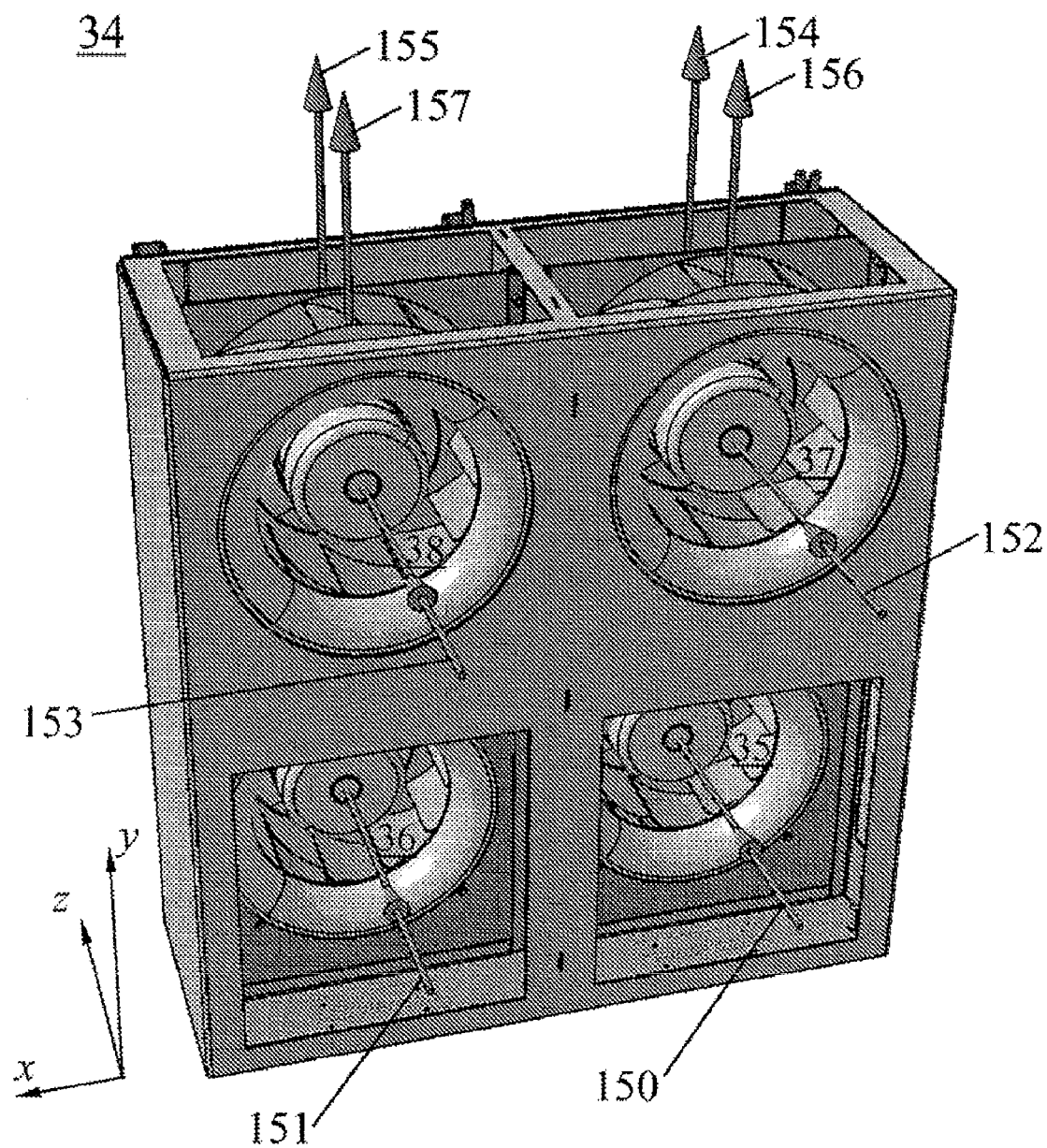
FIG. 17 illustrates a perspective view of a bottom view of the air-moving assembly.

FIG. 16 shows the upper air-moving assembly 34, which in the prototype embodiment comprises, in addition to the four fan-and-housing assemblies 40, a sheet-metal four-fan enclosure 167 whose surfaces facing the −z and +y directions are substantially open, as shown in FIG. 17, so as to minimize aerodynamic resistance that would impede intake airstreams 150, 152 and exhaust airstreams 154, 156. Referring again to FIG. 16, the upper air-moving assembly 34 also comprises an array of four female fan connectors 168 that are attached to the four-fan enclosure 167 and which mate with the male-fan connectors 165 on the fan-and-housing assemblies 143 in order to provide the fans with electrical power and signals that originate from remote equipment (not shown), and are carried to the female fan connectors by remote fan cables 169, which are retained and protected by surrounding skids 170. A similar design pertains to the lower air-moving assembly 39, which is just an upside-down replica of the upper air-moving assembly 34.

Figure 18:
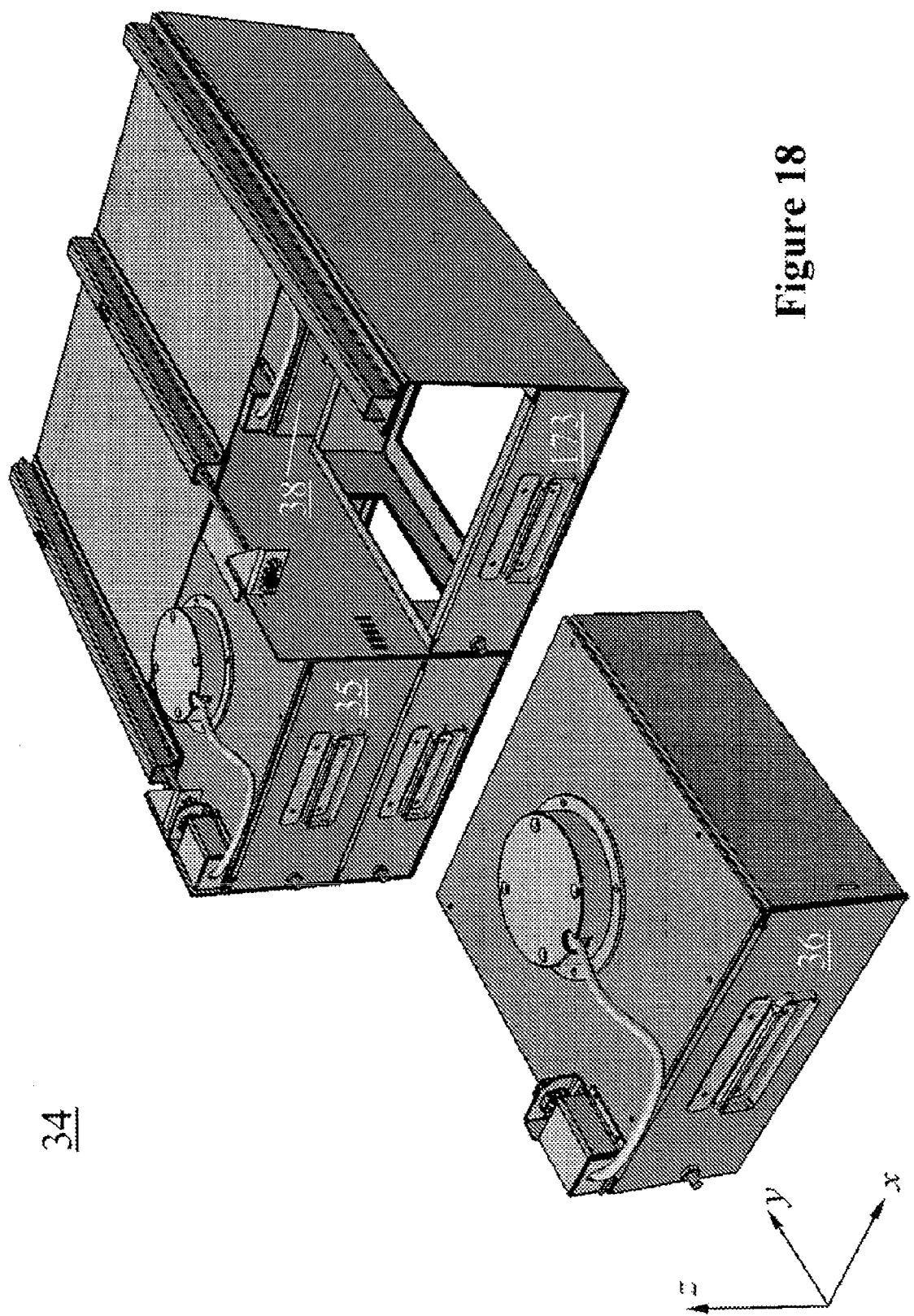
FIG. 18 illustrates a perspective view showing the detachment of a fan from the air-moving assembly.

A handle 171 is provided on each fan-and-housing assembly 143 to facilitate its removal from the upper air-moving assembly 34 should a fan fail. Removal of one of the outer fans 35, 36, which automatically disconnects its male fan connector 165 from the female fan connector 168, is accomplished by releasing a latch 172 and pulling the handle 171 in the −y direction, as illustrated with regard to the outer right fan 36 in FIG. 18. This figure also reveals a support box 173. There are two such boxes, as shown, whose function is to hold the outer fans 35, 36 in position against the force of gravity while still allowing unimpeded flow of air in the z direction. In the prototype embodiment, removing one of the outer fans 35, 36 (and one of the support boxes 173) is prerequisite to removing one of the inner fans 37, 38; however, this is necessary only if the outer and inner fans overlap in the z direction to save space (as previously described in connection with FIG. 14). If there is no z overlap, then the outer and inner fans may be made independently removable, like conventional drawers.

It is important that the closed air loop 23 be reasonably tightly sealed to ensure that air will not leak from high-pressure areas to low-pressure areas, because such leaks would diminish the amount of cooling air that actually circulates in the closed air loop 23. Sealing is particularly important in the vicinity of the top-rear-region 148 and bottom-front region 149, because these areas are high-pressure plenums that readily leak air to the atmospheric pressure surrounding the enclosure 1 and to other low-pressure regions such as the fan intakes. For example, in the prototype embodiment, the positive pressure in the plenums is approximately 280 to 350 Pa (depending on conditions), and the pressure difference across the stack of front thermally neutral units is about 400 Pa. To prevent depressurization of the high-pressure plenums when the doors 2 of the enclosure are opened for access, a plenum box 174, which is open on its −y and −z faces, encloses the top-rear region 148, and another such box (shown in FIG. 19), which is open only on its +y and +z faces, encloses the bottom-front region 149. In addition, in order to prevent aerodynamic short-circuiting of the fans, it is important that the high-pressure plenums be sealed off from the low-pressure fan intakes, by placing sealing means between the +z surface of the lower fan unit 39 and +y surface of the lowest front blade cage 50.

Figure 19:
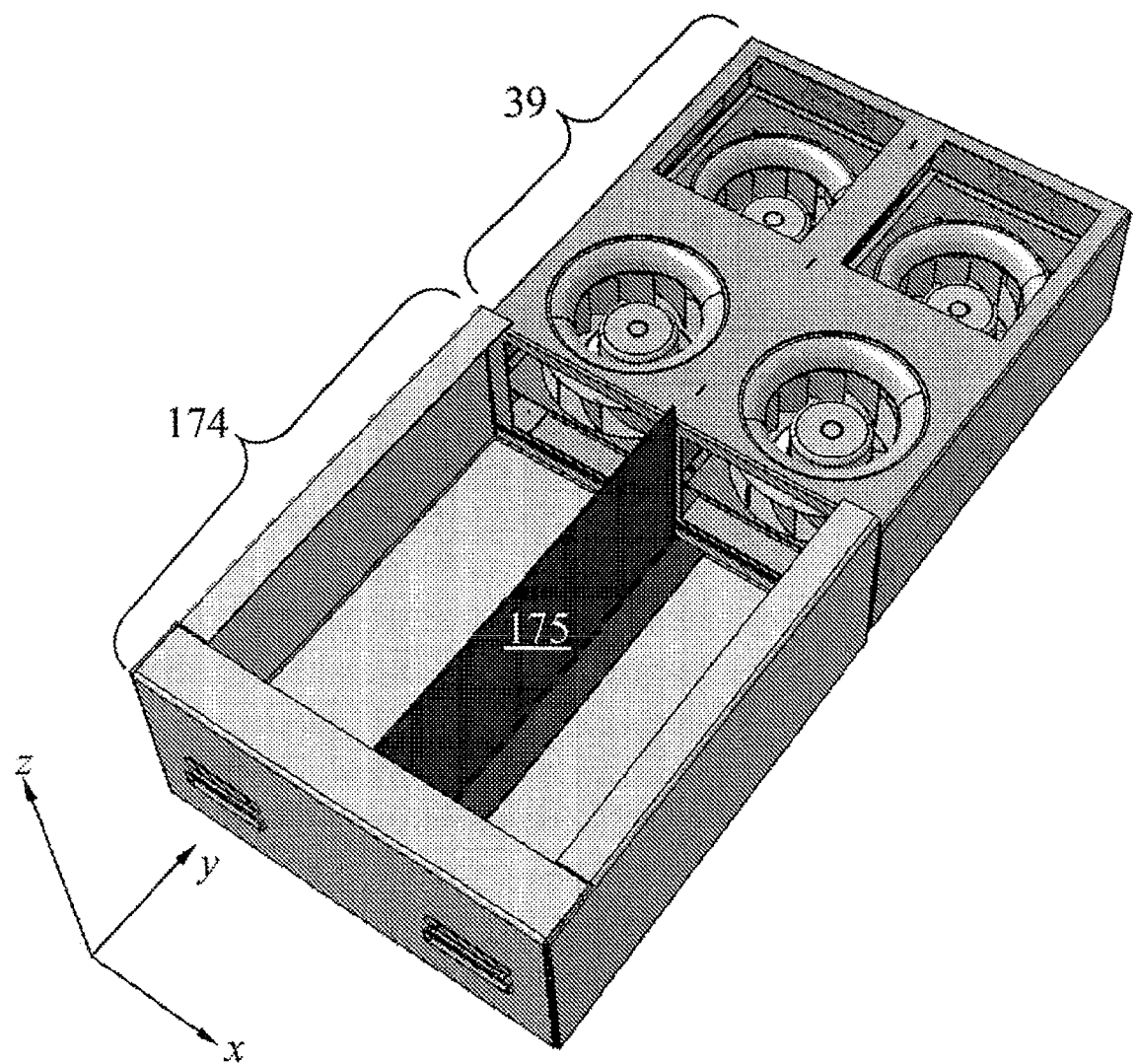
FIG. 19 illustrates a perspective view of a lower air-moving assembly and plenum box.

With the prototype embodiment, it has been ascertained experimentally that a splitter plate 175 shown in FIG. 19, which bisects the plenum box 174 parallel to the yz plane, aids in distributing the air emerging from the lower fans more evenly in the plenum box, thereby sharing the air more evenly between the +x and −x halves of the enclosure 1 and leading to better thermal performance (lower maximum temperature) of air-cooled heat-producing components arranged in the enclosure. Without the splitter plate 175, the air emerging from the fans tends to favor the −x side of the plenum box 174, apparently due to the clockwise rotation of the fans in FIG. 19. The splitter plate 175 helps prevent too much air from flowing to the −x side of the plenum box by guiding the flow of air from the right-side fans to stay in the right half of the plenum box. The maximum air-cooled temperature in the prototype enclosure 1 was thereby reduced by about 6° C.

Figure 20:
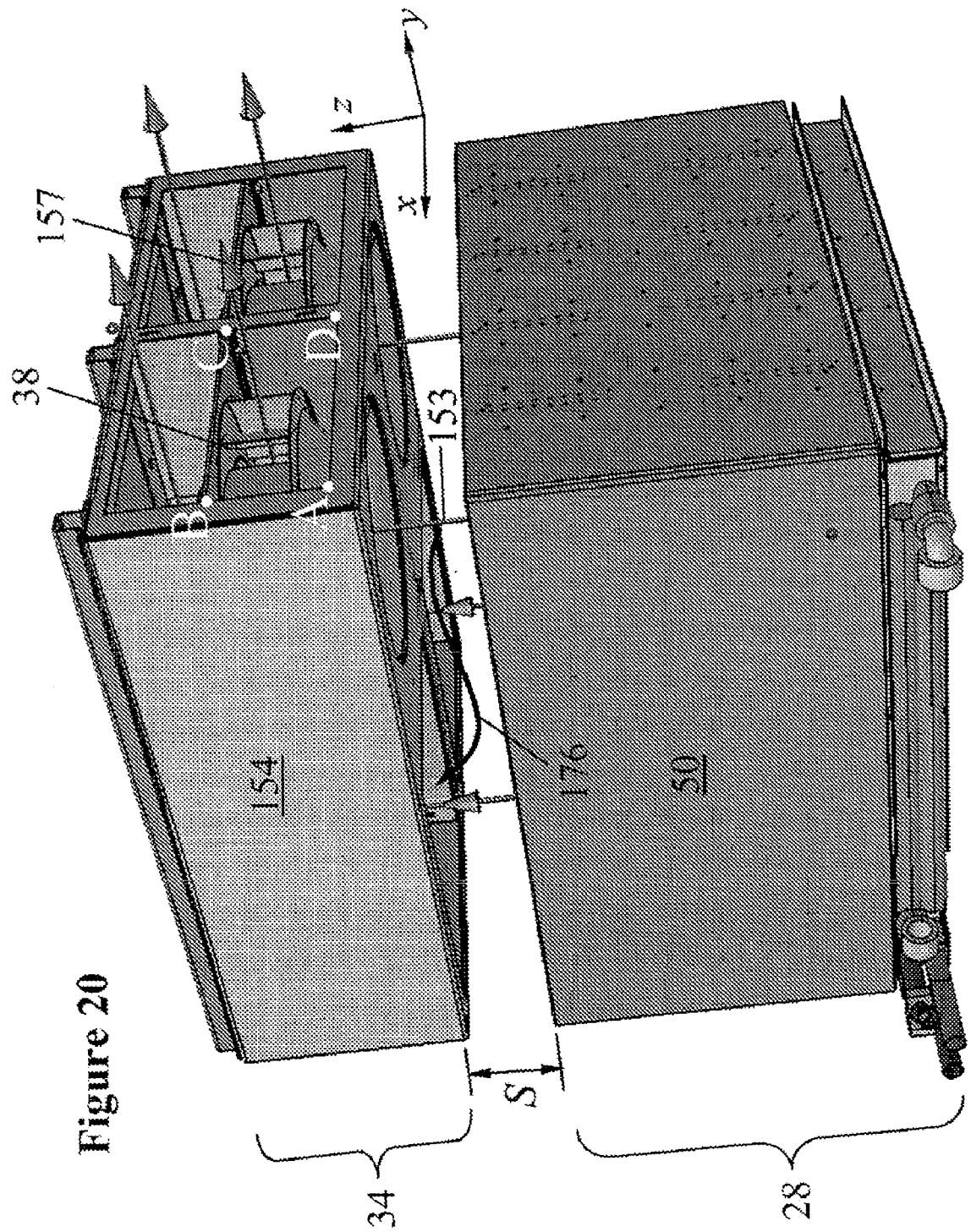
FIG. 20 illustrates a perspective view of an upper air-moving assembly showing an arrangement that mitigates the detrimental thermal effect of a fan failure.

FIG. 20 shows the topmost thermally neutral front unit 28 as well as the upper air-moving assembly 34. To allow for failure of one of the fans 35-38 without overheating the air-cooled heat-producing components 21, the preferred embodiment of the invention has a separation S between the +z face of the blade cage 50 and the −z face of the four-fan enclosure 167. It must be noted that when a fan such as 38 fails, in order to prevent aerodynamic short-circuiting of the other fans through the open aperture created by the failed fan, it is necessary that the failed-fan's exhaust area ABCD be sealed by a pivoting flat plate (not shown) that is hinged along BC and normally blown open by the airstream 157, but which falls under the force of gravity or a spring when there is a cessation in the failed-fan's exhaust airstream 157. Thus, the air that normally travels upward through the failed fan (airstream 153) must be imparted an alternative route; otherwise, heat-producing components directly beneath the failed fan, in the blade cage 50, will overheat. This alternative route is provided for by the separation S, which allows alternative air paths such as 176 through the other, still-functioning fans. Let ΔT be the increase in worst-case temperature of heat-producing components due to a fan failure. In the prototype embodiment, experiments show ΔT=32° C. with S=10 mm (the smallest value of S tested), but that ΔT=2° C. with S=35 mm. That is, with S=35 mm, the system and functioning thereof is virtually immune to the failure of a fan.

Figure 21:
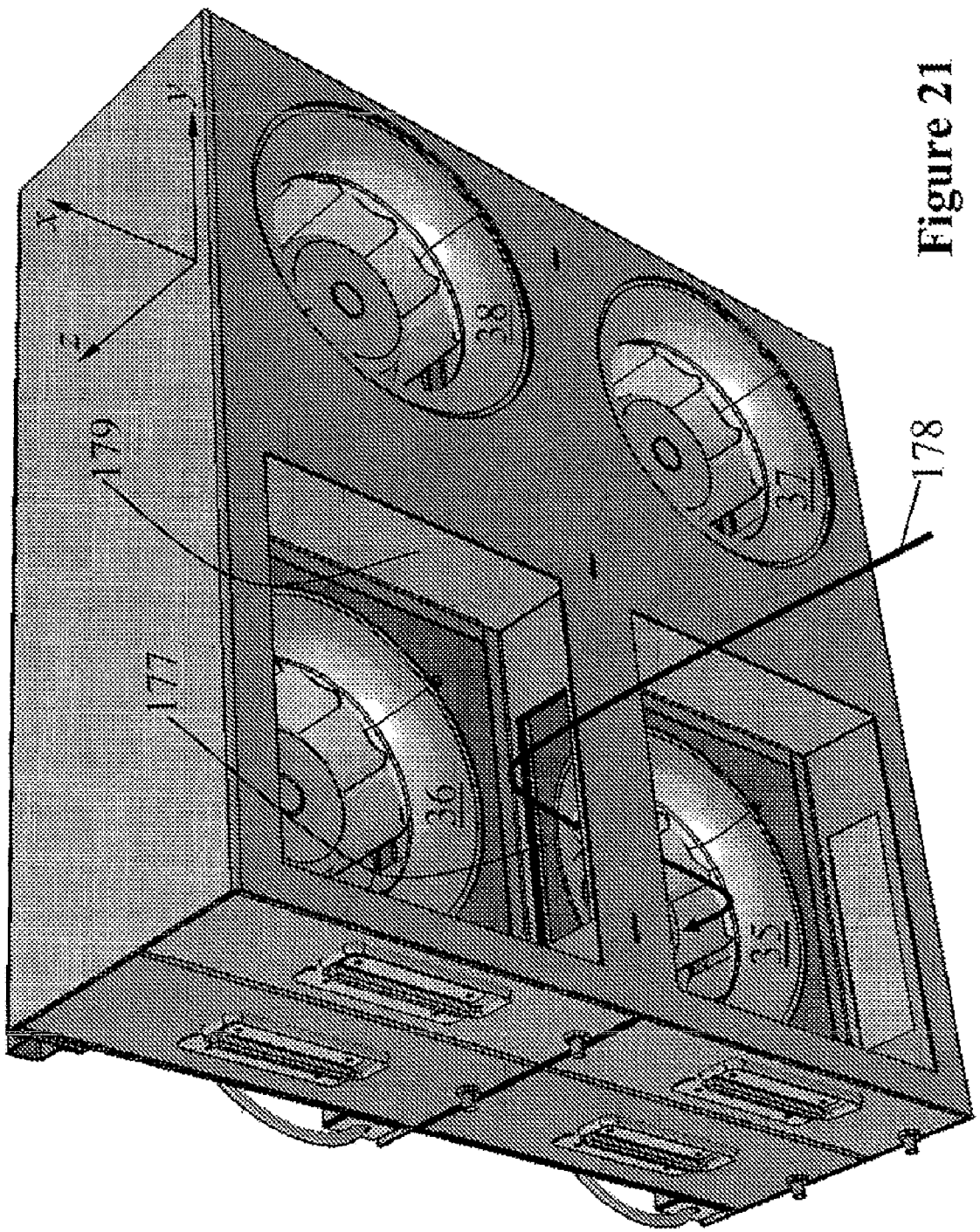
FIG. 21 illustrates a perspective view of an upper air-moving assembly, showing an alternative arrangement that mitigates the detrimental thermal effect of a fan failure.

Referring to FIG. 21, alternative embodiments may use other techniques to allow for fan failure without sacrificing the vertical space represented by S. For example, even with S=0, an alternative path for the airstream normally handled by one of the outer fan 35, 36 may be provided by permanent openings 177 in the side walls of the support boxes 173 that otherwise separate the intake airstreams of the two outer fans. Then, for example, if fan 36 fails, an alternative air path such as 178 is possible, which prevents heat-producing components beneath the failed fan from overheating. If one of the inner fans 37, 38 fails, providing an alternative air path with S=0 is more difficult than for the outer fans, because, for example, the wall 179 between inner fan 38 and outer fan 36 seals the high-pressure exhaust of fan 38 from the low-pressure intake of fan 36, and thus must not pass air under normal circumstances when all fans are running. However, it is possible to construct a louvered opening in wall 179, whose louvers would open only when fan 38 fails.

Bulk Power Supply

FIG. 22 illustrates the manner in which bulk power supplies, which convert electrical power from AC to DC, may be integrated into the enclosure 1 described by this invention. Such supplies, which ordinarily are 90% efficient and thus dissipate internally as heat about one-ninth (11%) of the power they deliver, are needed for typical heat-producing components, such as computer processor and memory chips. Off-the-shelf bulk-power-supply modules 180 are readily available that provide 4 kW of power in a package having xyz dimensions of about 127 mm×385 mm×127 mm. FIG. 22 illustrates one embodiment of the invention in which twenty-four such power-supply modules (enough for an 80 kW rack with redundancy) are housed in their own power-supply enclosure 181 that abuts the −x face of the enclosure frame 3. The power-supply enclosure 181 is aerodynamically isolated from the main enclosure 1 so that the closed loop of air 23 in the main enclosure 1 does not enter the power-supply enclosure 181. The power-supply modules 180 are arranged in two stacks; i.e., a front stack 182 whose modules 180 are removable (for repair and replacement) from the −y face of the power-supply enclosure 181; and a rear stack 183 whose modules 180 are similarly removable from the +y face of the power-supply enclosure. As shown, the front stack draws inlet cooling air 184 towards the +y direction; the rear stack draws inlet cooling air 185 toward the −y direction. Both stacks 182, 183 exhaust cooling air 186 towards the +z direction through an aperture 187 in the power-supply enclosure. Thus, for such off-the-shelf power-supply modules 180, the relatively small mount of heat dissipated in the power supplies is expelled to room air, and must be treated conventionally by external air-handling units. For example, if the power required in the enclosure 1 is 80 kW and the power supplies are 90% efficient, 8.9 kW is expelled to room air.

An alternative embodiment may employ custom bulk power-supply modules that admit bottom-to-top airflow, thereby allowing the power-supply modules to employ, like the blade cages 10, 15, closed-loop liquid-assisted air cooling, in keeping with the inventive objective of eliminating the air-cooling burden on the machine room.

While the present invention has been particularly shown and described with respect to preferred embodiments thereof it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

The invention claimed is:

1. A method of cooling heat-generating high-power electronic components and low-power electronic components, which are housed in an enclosure, said method comprising:
   cooling said high-power electronic components by a direct liquid cooling circulation loop; and
   cooling said low-power electronic components by a liquid-assisted air cooling circuit which comprises a plurality of heating and cooling zones, and locating air movers in the path of the airflow of said air cooling circulation loop, said air movers being arranged to prevent interference with their respective airstreams flowing through said path.

2. A method as claimed in claim 1, wherein said liquid-assisted air cooling circulation loop includes a closed-loop air flow path.

3. A method as claimed in claim 2, wherein liquids employed in said liquid-assisted air cooling circulation loop and in said direct liquid cooling circulation loop are separate and distinct from each other throughout their respective flow paths.

4. A method as claimed in claim 3, wherein at least one heat exchanger is arranged in said closed-loop air flow path for transferring heat therefrom to said air-assisting liquid cooling circuit.

5. A method as claimed in claim 1, wherein said air movers comprise centrifugal fans arranged in an over-and-under, fore-and-aft, orientation in, respectively, upper and lower housings for turning the flow of air in said air circulation loop.

6. A method as claimed in claim 5, wherein interior surfaces of said enclosure are equipped with acoustic insulation so as to acoustically attenuate the amount of acoustical noise, produced by said centrifugal fans, that is transmitted across said surfaces to the outside of said enclosure.

7. A method as claimed in claim 6, wherein said air movers are provided with means for diverting the flow of air streaming through said air circulation loop into an alternate path upon failure of a centrifugal fan so as to inhibit an aerodynamic short-circuiting of the remaining centrifugal fans.

8. A method as claimed in claim 7, wherein said diverting means comprises a pivotable plate for closing an exhaust of the failed centrifugal fan, and further comprises openable louvers formed in a wall between centrifugal fans in each respective housing.

9. A method as claimed in claim 4, wherein quick-connects, which are located at the same vertical space as said heat exchanger, facilitate flow of direct cooling liquid through a manifold supply pipe to said direct liquid cooling circulation loop and therefrom to a return line so as to form a vertical space-saving configuration in said enclosure.

10. A method as claimed in claim 7, wherein one or more splitter plates bisect a plenum box in said air flow so as to aid air emerging from said lower centrifugal fans more evenly in said plenum box and improve upon cooling of the air-cooled heat generating electronic components in said enclosure.

11. A method as claimed in claim 1, wherein said low-power components include a plurality of Dual-In-Line Memory Modules (DIMM), said DIMMs being arranged such that a flow of cooling air passes through no more than one DIMM in each respective cooling zone at any time so as to prevent overheating of successive DIMMs by overheated air flows.

12. A method as claimed in claim 4, wherein said at least one air-to-liquid heat exchanger is located interleaved with rows of packages for cooling the flow of air in each said row passage prior to said flow of air entering a subsequent row passage, said packages comprising blades mounting said heat-generating components and diverse operative components, said rows of blades being attached to at least one side of at least one or more midplanes comprising circuit cards for electrical interconnections.

13. A method as claimed in claim 12, wherein said referring to an imaginary Cartesian coordinate system having axes x, y, and z, a first stack of said rows of blades and heat exchangers is stacked along the z axis on a −y side of said one or more midplanes that lie in a central plane parallel to the x and z axes, similarly stacking a second stack of said rows of blades and heat exchangers along the z axis on a +y side of said one or more midplanes, a first set of air movers is located at a +z end of said first stack, a first plenum at a +z end of said second stack, locating a second set of air movers at a −z end of said second stack, and a second plenum is located at a −z end of said first stack, such that said flow of air is conveyed, by means of said air movers, along a closed loop comprising, in stream-wise order, said first stack of blades through which air flows toward the +z direction, said first set of air movers into which air flows toward the +z direction and from which it exhausts toward the +y direction, said first plenum into which air flows toward the +y direction and from which it exhausts toward the −z direction, said second stack of blades through which air flows toward the −z direction, said second set of air movers into which air flows toward the −z direction and from which it exhausts toward the −y direction, and finally said second plenum into which air flows toward the −y direction and from which it exhausts toward the +z direction into said first stack, thereby completing said closed loop.

14. A method as claimed in claim 13, wherein in a blade, the electronic components are mounted on a blade circuit card and further the corresponding power converters for one or more electronic components are mounted on the directly opposite surface of said blade circuit card.

* * * * *